(12) United States Patent
Ishibashi et al.

(10) Patent No.: US 6,456,639 B2
(45) Date of Patent: Sep. 24, 2002

(54) SEMICONDUCTOR LIGHT EMITTING DEVICE WITH II-VI GROUP SEMICONDUCTOR CONTACT LAYER CONTAINING ALKALI METAL IMPURITY, METHOD OF PRODUCING THE SAME, AND OPTICAL DEVICE INCLUDING SAME

(75) Inventors: Akira Ishibashi, Kanagawa; Yoshinori Hatanaka; Toru Aoki, both of Shizuoka; Masaharu Nagai, Kanagawa, all of (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/864,758

(22) Filed: May 24, 2001

Related U.S. Application Data

(62) Division of application No. 09/048,048, filed on Mar. 26, 1998.

(30) Foreign Application Priority Data

Mar. 27, 1997 (JP) .......................................... P09-076157
Sep. 11, 1997 (JP) .......................................... P09-247326

(51) Int. Cl.[7] .............................. H01S 5/00; H01L 29/22; H01L 33/00
(52) U.S. Cl. ............................. 372/45; 372/46; 257/78; 257/103
(58) Field of Search .................. 372/43–46; 257/96–97, 257/101–103, 78, 15

(56) References Cited

U.S. PATENT DOCUMENTS

| 4,992,837 A | 2/1991 | Sakai et al. .................... 257/17 |
| 5,140,385 A | 8/1992 | Kukimoto et al. ............. 257/12 |
| 5,548,137 A * | 8/1996 | Fan et al. ..................... 257/191 |

FOREIGN PATENT DOCUMENTS

| EP | 0541373 A2 | 5/1993 |
| EP | 0674348 A1 | 9/1995 |
| WO | WO 94/15369 | 7/1994 |
| WO | WO 94/18709 | 8/1994 |

OTHER PUBLICATIONS

Y. Hatanaka, et al., "Heavily Doped P-Type ZnSe Layer Formation By Excimer Laser Doping," *Journal Of Crystal Growth*, 1998, p. 425–428.

* cited by examiner

Primary Examiner—Paul Ip
Assistant Examiner—James Menefee
(74) Attorney, Agent, or Firm—Sonnenschein Nath & Rosenthal

(57) ABSTRACT

The invention provides a semiconductor light emitting device whose operating voltage can be easily reduced, a method of producing the same, and an optical device. An n-type clad layer, a first guide layer, an active layer, a second guide layer, a p-type clad layer, a first semiconductor layer, and a second semiconductor layer of ZnSe are successively grown on an n-type substrate. An alkali compound layer of $Na_2Se$ is then formed thereon. Subsequently, a heat treatment is performed by means of irradiation of an excimer laser beam so that at least a part of the second semiconductor layer and at least a part of the alkali compound layer are altered thereby forming a contact layer. Furthermore, a p-side electrode is formed on the contact layer. The contact layer contains an alkali metal serving as a p-type impurity so that the contact layer has a low electric resistance thereby achieving a reduction in the operating voltage and thus a reduction in the operating power. As a result of the reduction in the operating power, the device life is improved.

5 Claims, 18 Drawing Sheets

SEMICONDUCTOR LIGHT EMITTING DEVICE WITH II-VI GROUP SEMICONDUCTOR CONTACT LAYER CONTAINING ALKALI METAL IMPURITY, METHOD OF PRODUCING THE SAME, AND OPTICAL DEVICE INCLUDING SAME

RELATED APPLICATION DATA

This application is a divisional of copending application Ser. No. 09/048,048 filed Mar. 26, 1998. The present and foregoing application claims priority to Japanese application Nos. P09-076157 filed Mar. 27, 1997 and No. P09-247326 filed Sep. 11, 1997. All of the foregoing applications are incorporated herein by reference to the extent permitted by law.

BACKGROUND OF THE INVENTION

1. Field of the Invention

The present invention relates to a semiconductor light emitting device having a multilayer structure comprising at least an n-type clad layer, an active layer, and a p-type clad layer each made of a II-VI group compound semiconductor, a method of producing the same, and an optical device provided with the same.

2. Description of the Related Art

In recent years, there is an increasing demand for high density and high resolution in recording and reproducing of data onto and from an optical disk or a magneto-optic disk. There are also attempts to develop a high-intensity display device, a low-loss optical fiber communication system, and an optical analysis instrument for analyzing DNA or special chemicals. Thus there is a need to develop a semiconductor light emitting device for use as a light source in these applications which is capable of emitting light with a color in the range of green and blue.

Promising candidates as materials used to form a semiconductor device capable of emitting light with a color in the range of green to blue are II-VI compound semiconductors containing at least one II-group element selected from the group consisting of zinc (Zn), magnesium (Mg), beryllium (Be), cadmium (Cd), mercury (Hg), and manganese (Mn) and at least one VI-group element selected from the group consisting of oxygen (O), sulfur (S), selenium (Se), and tellurium (Te). However, such a II-VI semiconductor light emitting device has a high Schottky barrier at interfaces between electrodes and semiconductors (refer to for example I. Suemune, Appl. Phys. Lett. 63 (1993) 2612), and thus has a high contact resistance which results in a high operating voltage. ZnSe is widely used as a layer in contact with an electrode. However, it is difficult to dope a p-type impurity into ZnSe to a high enough level to obtain a high enough carrier concentration. This makes it difficult to realize a good ohmic contact, and the result is a high operating voltage. As a result, high power dissipation occurs, which results in heat generation which in turn causes degradation of the device.

One technique proposed to avoid the above problem is to form an additional ZnTe layer on the ZnSe layer in such a manner that the ZnTe layer is doped with a p-type impurity to a higher level than that of the ZnSe layer so that the highly-doped ZnTe layer serves as a contact layer with the p-side electrode. However, if the ZnSe layer is grown directly on the ZnTe layer, a great valence-band discontinuity occurs at the interface between the ZnSe and ZnTe layers. This great valence-band discontinuity results in a high resistance which makes it impossible to achieve a low operating voltage. One technique proposed to solve the above problem is to employ a graded ZnSeTe layer in which the Se-Te composition ratio is gradually changed, thereby reducing the operating voltage (refer to for example Y. Fan, D. C. Grillo, M. D. Rinqle, J. Han, L. He, R. L. Gunshor, A. Salokatve, H. Jeon, M. Hovinen, A. V. Nurmikko, G. C. Hua and N. Otsuka, J. Vac. Sci. Technol. B12 (1994) 2480). Another technique proposed for the same purpose is to dispose a superlattice layer consisting of ZnSe and ZnTe between the ZnSe and ZnTe layers (refer to for example F. Hiei, M. Ikeda, M. Ozawa, T. Miyajima, A. Ishibashi and K. Akimoto, Electron. Lett., 29 (1993) 878; Japanese Patent Laid-Open No. 6-5920).

The above techniques in which a composition-graded layer or a superlattice layer is employed have the problem that it is difficult to form such a layer with high crystal quality. ZnSe has a lattice constant of 5.66942 Å while the lattice constant of ZnTe is 6.10 Å. Such a large difference in the lattice constant causes introduction of misfit dislocations when a ZnTe layer is grown on a ZnSe layer. Misfit dislocations act as hole traps which cause a reduction in the concentration of p-type carriers which in turn results in an increase in the operating voltage. As a result, it is impossible to achieve a sufficient reduction in the power dissipation and thus it is impossible to avoid the degradation of the device to a sufficient degree.

SUMMARY OF THE INVENTION

In view of the above, it is an object of the present invention to provide a semiconductor light emitting device whose operating voltage can be easily reduced to a low enough level, a method of producing such a light emitting device, and an optical device provided with such a light emitting device.

According to an aspect of the invention, there is provided a semiconductor light emitting device comprising at least an n-type clad layer, an active layer, and a p-type clad layer formed into a multilayer structure using a II-VI compound semiconductor containing at least one II-group element selected from the group consisting of zinc, magnesium, beryllium, cadmium, manganese, and mercury and at least one VI-group element selected from the group consisting of oxygen, sulfur, selenium, and tellurium, the semiconductor light emitting device also comprising a p-side electrode electrically connected to the p-type clad layer, the semiconductor light emitting device being characterized in that a contact layer is provided between the p-type clad layer and the p-side electrode, the contact layer being formed, at least in part, of a II-VI group semiconductor containing an alkali metal element serving as a p-type impurity.

According to another aspect of the invention, there is provided a semiconductor light emitting device comprising at least an n-type clad layer, an active layer, and a p-type clad layer formed into a multilayer structure using a II-VI compound semiconductor containing at least one II-group element selected from the group consisting of zinc, magnesium, beryllium, cadmium, manganese, and mercury and at least one VI-group element selected from the group consisting of oxygen, sulfur, selenium, and tellurium, the semiconductor light emitting device also comprising a p-side electrode electrically connected to the p-type clad layer, wherein there is provided a contact layer between the p-type clad layer and the p-side electrode, the contact layer containing a product of thermal reaction between an alkali compound and a II-VI group compound semiconductor, or containing an alkali compound and a product of thermal reaction between an alkali compound and a II-VI group compound semiconductor.

According to still another aspect of the invention, there is provided a method of producing a semiconductor light emitting device comprising at least an n-type clad layer, an active layer, and a p-type clad layer formed into a multilayer structure using a II-VI compound semiconductor containing at least one II-group element selected from the group consisting of zinc, magnesium, beryllium, cadmium, manganese, and mercury and at least one VI-group element selected from the group consisting of oxygen, sulfur, selenium, and tellurium, the method comprising the steps of: forming a plurality of II-VI group compound semiconductor layers into a multilayer structure, the semiconductor layers including at least the n-type clad layer, the active layer, and the p-type clad layer; forming an alkali compound layer on the surface of a II-VI group compound layer located on the side, adjacent to the p-type clad layer, of the active layer; after said step of forming the alkali compound layer, forming a p-side electrode in an area corresponding to the alkali compound layer;

According to still another aspect of the invention, there is provided an optical device including a semiconductor light emitting device, the semiconductor light emitting device comprising at least an n-type clad layer, an active layer, and a p-type clad layer formed into a multilayer structure using a II-VI compound semiconductor containing at least one II-group element selected from the group consisting of zinc, magnesium, beryllium, cadmium, manganese, and mercury and at least one VI-group element selected from the group consisting of oxygen, sulfur, selenium, and tellurium, the semiconductor light emitting device also comprising a p-side electrode electrically connected to the p-type clad layer, wherein a contact layer is provided between the p-type clad layer and the p-side electrode, the contact layer being formed, at least in part, of a II-VI group semiconductor containing an alkali metal element serving as a p-type impurity.

According to still another aspect of the invention, there is provided an optical device including a semiconductor light emitting device, the semiconductor light emitting device comprising at least an n-type clad layer, an active layer, and a p-type clad layer formed into a multilayer structure using a II-VI compound semiconductor containing at least one II-group element selected from the group consisting of zinc, magnesium, beryllium, cadmium, manganese, and mercury and at least one VI-group element selected from the group consisting of oxygen, sulfur, selenium, and tellurium, the semiconductor light emitting device also comprising a p-side electrode electrically connected to the p-type clad layer, wherein there is provided a contact layer between the p-type clad layer and the p-side electrode, the contact layer containing a product of thermal reaction between an alkali compound and a II-VI group compound semiconductor, or containing an alkali compound and a product of thermal reaction between an alkali compound and a II-VI group compound semiconductor.

In the semiconductor light emitting device according to the present invention, when a voltage is applied between the n-side electrode and the p-side electrode, a current is injected into the active layer via the contact layer. As a result of the injection of the current, emission of light occurs in the active layer. Because the contact layer is doped with an alkali metal element so that it has a low electric resistance, the electric resistance at the interface between the p-side electrode and the contact layer becomes low and thus the voltage drop across the interface also becomes low. As a result, the semiconductor light emitting device can be operated with low electric power without generating a significantly great amount of heat, and thus a long device life can be achieved.

In the semiconductor light emitting device according to another aspect of the present invention, when a voltage is applied between the n-side electrode and the p-side electrode, a current is injected into the active layer via the contact layer. As a result of the injection of the current, emission of light occurs in the active layer. Because the contact layer is formed to have a low electric resistance by means of incorporating a product of thermal reaction between an alkali compound and a II-VI group compound semiconductor, the electric resistance at the interface between the p-side electrode and the contact layer becomes low and thus the semiconductor light emitting device can be operated with low electric power.

In the semiconductor light emitting device according to still another aspect of the present invention, a plurality of II-VI group compound layers including at least an n-type clad layer, an active layer, and a p-type clad layer are formed into a multilayer structure, and then an alkali compound layer is formed on the surface of a II-VI group compound layer located on the side, adjacent to the p-type clad layer, of the active layer. After that, a p-side electrode is formed in an area corresponding to the alkali compound layer.

Furthermore, since the optical device according to the invention has a semiconductor light emitting device according to the invention, the semiconductor light emitting device can be operated such that light is emitted in its active layer by applying a small voltage.

DESCRIPTION OF THE PREFERRED EMBODIMENTS

The present invention is described in further detail below with reference to preferred embodiments in conjunction with the accompanying drawings.

Figure 1:
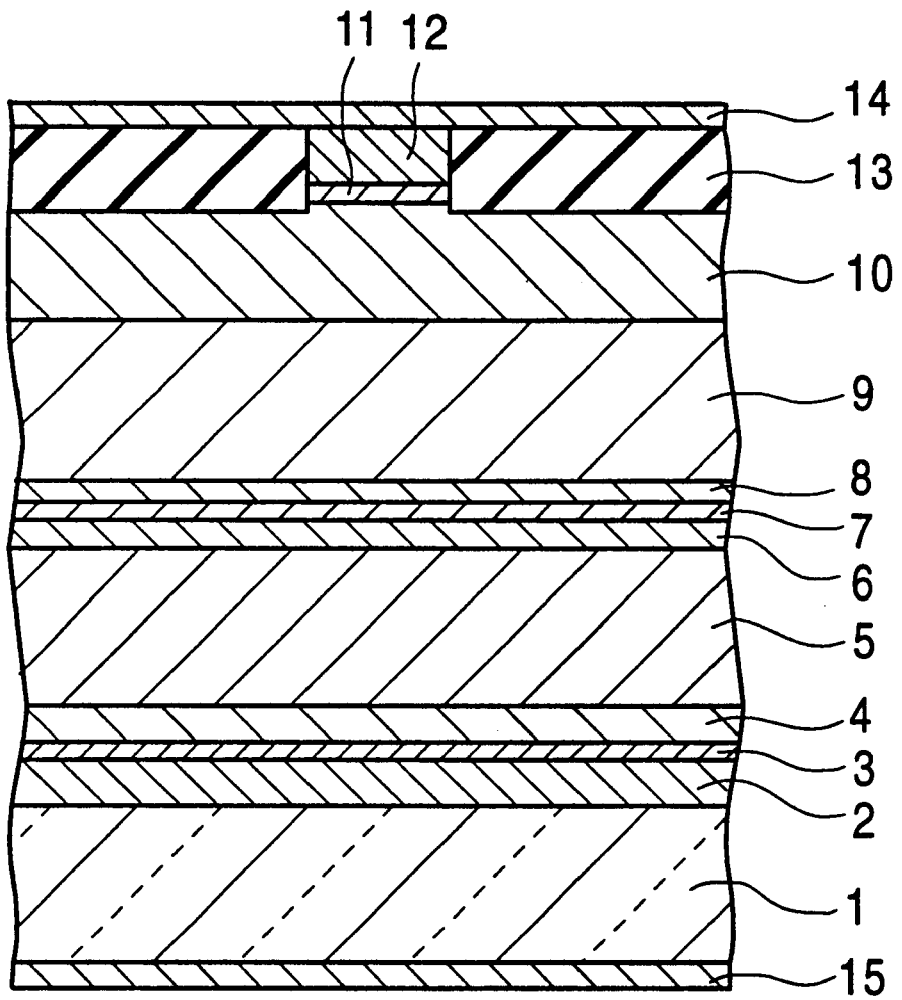
FIG. 1 is a cross-sectional view illustrating the structure of a semiconductor light emitting device according to a first embodiment of the invention.

FIG. 1 illustrates the structure of a first embodiment of a semiconductor light emitting device according to the present invention. The semiconductor light emitting device comprises a substrate 1 and semiconductor layers successively formed thereon one on another in the following order: a III-V buffer layer 2, a first II-VI group buffer layer 3 of a II-VI compound semiconductor, a second II-VI group buffer layer 4 of a II-VI compound semiconductor, an n-type clad layer 5, a first guide layer 6, an active layer 7, a second guide layer 8, a p-type clad layer 9, a first semiconductor layer 10, and a second semiconductor layer 11.

The substrate 1 is for example made of n-type GaAs having a thickness of 100 to 350 $\mu$m and doped with silicon (Si) acting as an n-type impurity. The III-V group buffer layer 2 is for example made of n-type GaAs having a thickness of 200 nm measured in the direction of growth (hereinafter referred to simply as the thickness) and doped with silicon serving as an n-type impurity.

The first II-VI group buffer layer 3 is for example made of n type ZnSe having thickness of 20 nm and doped with chlorine (Cl) serving as an n-type impurity. The second II-VI group buffer layer 4 is for example made of n type ZnSSe having a thickness of 200 nm and doped with chlorine serving as an n-type impurity. The n-type clad layer 5 is for example made of an n-type ZnMgSSe mixed crystal having a thickness of 1 $\mu$m and doped with chlorine serving as an n-type impurity.

The first guide layer 6 is for example made of a ZnSSe mixed crystal having a thickness of 100 nm and doped with chlorine serving as an n-type impurity or doped with no impurity. In the ZnSSe mixed crystal, the composition ratios of VI-group elements are selected as 6% for S and 94% for Se so that the ZnSSe mixed crystal has a lattice constant matched with that of GaAs used to form the substrate 1.

The active layer 7 is formed, for example, into a single quantum well structure with a thickness of 6 nm using a ZnCdSe mixed crystal. In the ZnCdSe mixed crystal, the composition ratios of II-group elements are selected as 75% for Zn and 25% for Cd so that the ZnCdSe mixed crystal has a lattice constant slightly greater than that of GaAs used to form the substrate 1.

The second guide layer 8 is for example made of a ZnSSe mixed crystal having a thickness of 100 nm and doped with nitrogen (N) serving as a p-type impurity or doped with no impurity. In the ZnSSe mixed crystal, the composition ratios of VI-group elements are selected as 6% for 5 and 94% for Se.

The p-type clad layer 9 is for example made of a p-type ZnMgSSe mixed crystal having a thickness of 1 $\mu$m and doped with nitrogen serving as a p-type impurity. The first semiconductor layer 10 is for example made of a p-type ZnMgSSe mixed crystal having a thickness of 1 $\mu$m and doped with nitrogen serving as a p-type impurity. The second semiconductor layer 11 is for example made of p-type ZnSe having a thickness of 100 nm and doped with nitrogen serving as a p-type impurity.

On the second semiconductor layer 11, there is provided a contact layer 12 having a thickness for example of 10 to 1000 nm. The contact layer 12 is made of a II-VI group compound semiconductor such as ZnSe containing, at least in a part thereof, a product of thermal reaction of the second semiconductor (ZnSe in this case) with an alkali compound, or containing an alkali compound as well as such a thermal reaction product. That is, the contact layer 12 is formed of a II-VI group compound semiconductor (ZnSe in this case) containing, at least in a part thereof, an alkali metal element serving as a p-type impurity. The alkali metal is doped for example at $1\times10^{18}$ to $1\times10^{21}$ atoms/cm$^3$ so that the contact layer 12 has a carrier concentration as high as about $1\times10^{19}$ 1/cm$^3$.

Alkali compounds preferable for this purpose include compounds of an alkali metal and a VI-group element, an alkali metal and phosphorus (P), and an alkali metal, VI-group element, and phosphorus. More preferably, the compound contains at least one alkali metal selected from the group consisting of sodium (Na) and potassium and at least one VI-group element selected from the group consisting of oxygen, sulfur, selenium, tellurium, and phosphorus. More specifically, the preferable compounds for this purpose include Na$_2$S, Na$_2$Se, Na$_2$O, Na$_2$O$_2$, Na$_2$Te, K$_2$S, K$_2$Se, NaPO$_3$, Na$_3$P, and K$_3$P.

The second semiconductor layer 11 and the contact layer 12 are formed into a stripe shape with a width of for example 10 $\mu$m which serves as a current confining part in which a current is confined. On the first semiconductor layer 10, in areas where the second semiconductor layer 12 and the contact layer 12 are not formed, there is provided an insulating layer 13 made of for example aluminum oxide ($Al_2O_3$).

On the insulating layer 13 and the contact layer 12, there is provided a p-side electrode 14 formed of a proper metal (such as gold (Au) or a metal containing gold) with a thickness of for example about 200 nm, wherein the p-side electrode 14 is electrically connected to the p-type clad layer 9 via the contact layer 12, the second semiconductor layer 11, and the first semiconductor layer 10. Although in the specific example shown in FIG. 1, the p-side electrode 14 is formed over the entire surface of the insulating layer 13 and the contact layer 12, the p-side electrode 14 may by formed only in a particular area corresponding to the contact layer 12 (so that all the area above the contact layer 12 and a partial area of the insulating layer 13 in the vicinity of the contact layer 12 are covered with the p-side electrode). On the back surface of the substrate 1, there is provided an n-side electrode 15 formed of for example indium (In), which is electrically connected to the n-type clad layer 5 via the substrate 1, the III-V group buffer layer 2, the first II-VI group buffer layer 3 and the second II-VI group buffer layer 4.

Although not shown in the figure, the semiconductor light emitting device also has two reflecting mirror layers formed on the respective two opposite sides perpendicular to the longitudinal direction of the contact layer 12 (i.e., perpendicular to the longitudinal direction of the resonator). The reflecting mirror layers are formed in a multilayer structure in which for example aluminum oxide films and silicon film are alternately disposed.

The semiconductor light emitting device having the structure described above may be produced as follows.

Figure 2A:
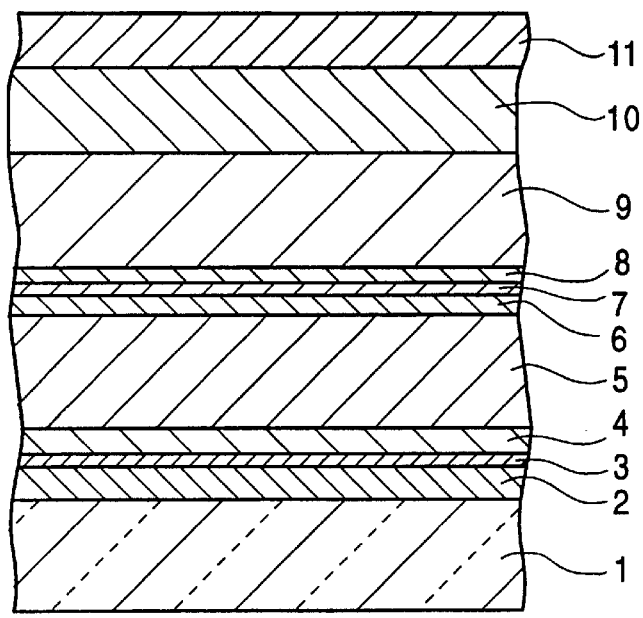
FIGS. 2A and 2B are cross-sectional views illustrating processing steps of producing the semiconductor light emitting device shown in FIG. 1.

The production process for this purpose is shown in FIGS. 2 to 4. First, as shown in FIG. 2A, a plurality of semiconductor layers are formed successively on the substrate 1 using a molecular beam epitaxy (MBE) technique so as to form a multilayer structure consisting of the III-V group buffer layer 2, the first II-VI group buffer layer 3, the second II-VI group buffer layer 4 of a II-VI compound semiconductor, the n-type clad layer 5, the first guide layer 6, the active layer 7, the second guide layer 8, the p-type clad layer 9, the first semiconductor layer 10, and the second semiconductor layer 11 (multilayer formation step).

Figure 5:
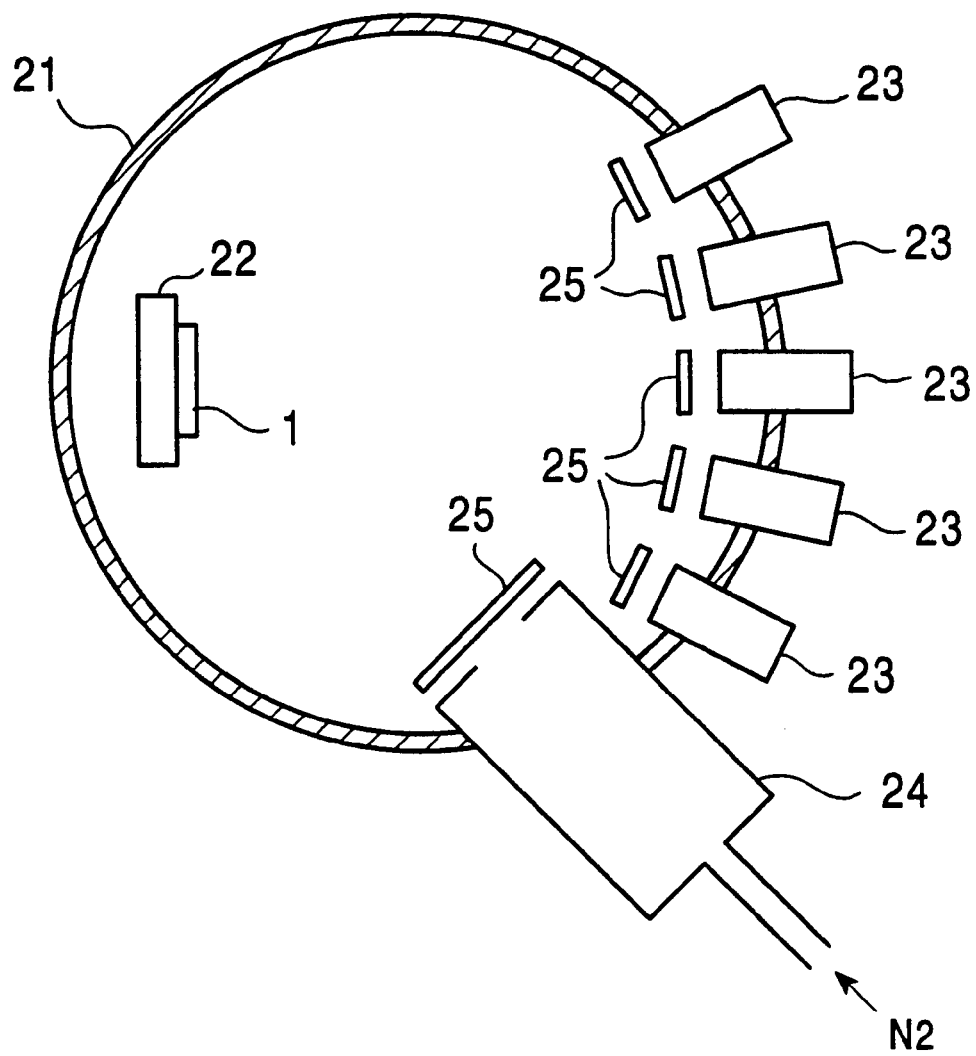
FIG. 5 is a schematic diagram illustrating an MBE crystal growing apparatus used to produce the semiconductor light emitting device shown in FIG. 1.

FIG. 5 illustrates the structure of the MBE crystal growing apparatus used herein. The MBE crystal growing apparatus has a vacuum chamber 21 in which there is provided a substrate holder 22 for holding a substrate 1. The vacuum chamber 21 has a plurality of particle beam generation cells (such as Knudsen cells) disposed so that they are directed to the substrate 1. The vacuum chamber 21 also has a plasma generation chamber 24 for generating a nitrogen plasma toward the substrate 1. The plasma generation chamber 24 comprises, for example, an ECR (electron cyclotron resonance) cell or an RF (radio frequency) cell. Shutters are disposed near the emission apertures of the respective particle beam generation cells 23 and also near the aperture of the plasma generation chamber 24 whereby the irradiation of each particle beam is controlled.

Using the MBE crystal growing apparatus having the above structure, particle beams of various source materials depending on the compositions of the compound semiconductors of the respective layers are emitted from the respective particle beam generation cells 23 so that the substrate is exposed to these particle beams thereby epitaxially growing the respective layers. The doping of silicon into the III-V group buffer layer 2 is performed by exposing the layer to a silicon particle beam together with the particle beams of the required source materials emitted from the corresponding particle beam generation cells 23. The doping of chlorine into the first II-VI group buffer layer 3, the second II-VI group buffer layer 4, the n-type clad layer 5, and the first guide layer 6, respectively, is performed by exposing the layers to a chlorine particle beam together with the particle beams of the required source materials emitted from the corresponding particle beam generation cells 23. On the other hand, the doping of nitrogen into the second guide layer 8, the p-type clad layer 9, the first semiconductor layer 10, and the second semiconductor layer 11 is performed by exposing the layers to a nitrogen plasma generated by the plasma generation chamber 24 as well as to the respective particle beams of source materials. Preferably, the III-V group buffer layer 2 and the II-VI group compound semiconductor layer thereon are formed separately in different vacuum chambers connected to each other via an ultra-high vacuum transfer path so as to prevent stacking faults being created at the interface between the III-V group buffer layer 2 and the II-VI group compound semiconductor layer.

Figure 2B:
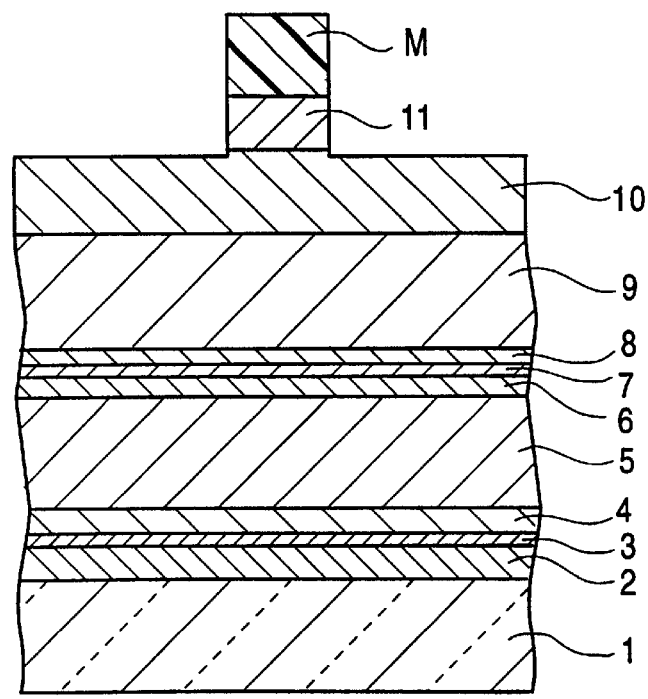
Figure 3A:
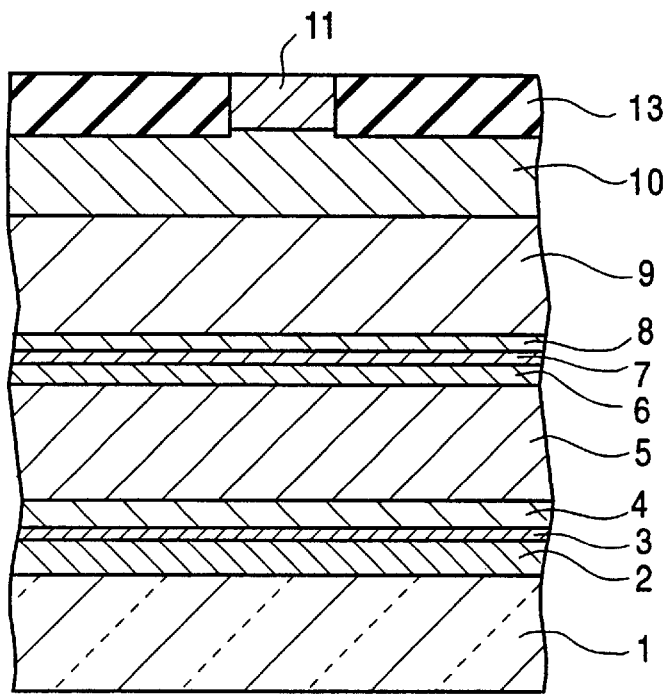
FIGS. 3A and 3B are cross-sectional views illustrating the processing steps following those shown in FIGS. 2A and 2B.

Then as shown in FIG. 2B, a resist film M is coated on the second semiconductor layer 11, and a mask pattern consisting of a plurality of parallel stripes is formed in the resist film M by means of photolithography. The second semiconductor layer 11 is then selectively removed by means of wet or dry etching using the resist film M as a mask thereby converting the second semiconductor layer 11 into the form of a plurality of parallel stripes so that they act as current confining parts. In FIG. 2B, only one of these stripes of the second semiconductor layer 11 is shown in a representative fashion (FIGS. 3 and 4 are also represented in a similar fashion). Subsequently, as shown in FIG. 3A, an insulating material such as aluminum oxide is evaporated over the entire surface (on the resist film M and the first semiconductor layer 10 which has appeared as a result of the selective removal of the second semiconductor layer 11). The resist film M is then removed (lifted off) together with the part of the insulating material evaporated on the resist film M thereby forming an insulating layer 13 (current confining part formation step).

After that, the surface of the second semiconductor layer 11 and that of the insulating layer 13 are cleaned (cleaning step). This cleaning process is needed to remove impurities (such as organic substances or carbon compounds) from the surface. If there is a residual impurity, a compound including the impurity is formed in the contact layer 12 in a later process (in which an alkali compound layer is formed on the second semiconductor layer 11 and a heat treatment is performed). The formation of such a compound of impurity would cause nonuniformity of current and thus degradation of current-voltage characteristic.

The cleaning process preferably includes the steps of cleaning organic impurities with acetone or the like and then performing cleaning with flowing water to an enough extent. After the cleaning with flowing water, chemical etching may be performed using an acid or alkaline etchant capable of dissolving the surface of the second semiconductor layer 11 so that a 10 Å surface portion is removed from the second semiconductor layer 11. In the device structure in which current confining parts are formed as is the case in the present embodiment, the cleaning process is particularly important because there is a possibility that the surface of the stripe-shaped second semiconductor layer 11 is contaminated.

After cleaning the surface, drying is performed at 120° C. for 10 min in a dry ambient (for example nitrogen ($N_2$)

ambient) so that water and impurities remaining on the surface are removed (heating and drying step). If there is residual water, when an alkali compound is evaporated on the surface of the second semiconductor layer 11 in a later step (alkali compound layer formation step), water is absorbed by the alkali compound having the property of deliquescence. The absorption of water brings about a bad influence on the formation of the interface between the contact layer 12 and the p-side electrode 14, and degradation occurs in the current-voltage characteristic. If there is also a residual impurity on the surface, the impurity is incorporated together with water and a compound including the impurity is formed partially in the contact layer 12.

Figure 3B:
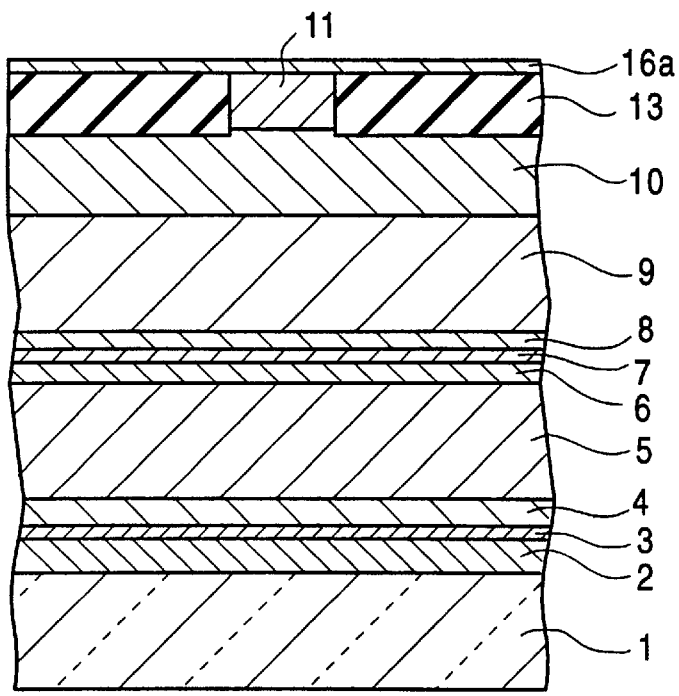

After the heating and drying process, as shown in FIG. 3B, an alkali compound (such as $Na_2Se$) is deposited on the second semiconductor layer 11 and the insulating layer 13 by means of vacuum evaporation in a vacuum evaporation apparatus not shown in the figure thereby forming the alkali compound layer 16a with a thickness of about 20 nm (alkali compound layer formation step). The thickness of the alkali compound layer 16a may be smaller or greater than the above value. In the thicker case, an excessive part of the alkali compound will disappear in a heating process performed later, and thus no problem occurs. The alkali compound layer 16a may be formed either over the entire surface of the second semiconductor layer 11 and the insulating layer 13 as shown in FIG. 3B, or in a particular limited area corresponding to the second semiconductor layer 11.

Because the alkali compound is deliquescent, it is preferable to perform the alkali compound layer formation process in a dry ambient. In this process, before performing evaporation of the alkali compound in the vacuum evaporation apparatus (not shown in the figure), the contaminant remaining on the surface may be removed by heating the substrate to a temperature in the range of 80° C. to 300° C. using a heater or by means of irradiation of an excimer laser beam or an electron beam.

Figure 4A:
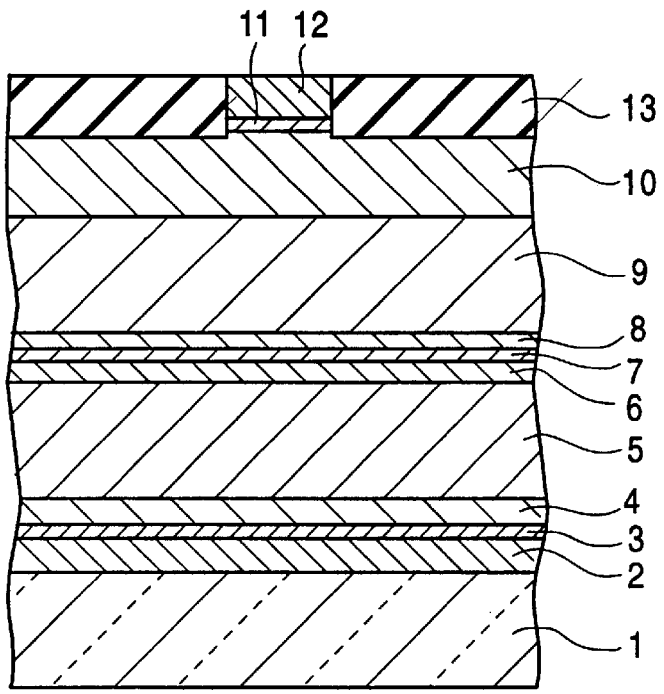
FIGS. 4A and 4B are cross-sectional views illustrating the processing steps following those shown in FIGS. 3A and 3B.

After the formation of the alkali compound layer 16a, a heat treatment is performed in a proper manner (for example by means of irradiation of an energy beam) thereby altering a part, on the side adjacent to the alkali compound layer 16a, of the second semiconductor layer 11 and at least a part, in contact with the second semiconductor layer 11, of the alkali compound layer 16a thus forming the contact layer 12 as shown in FIG. 4A (heat treatment step). By way of example, the heat treatment is described in further detail below for the case where the heat treatment is performed by means of irradiation of an energy beam.

Figure 6:
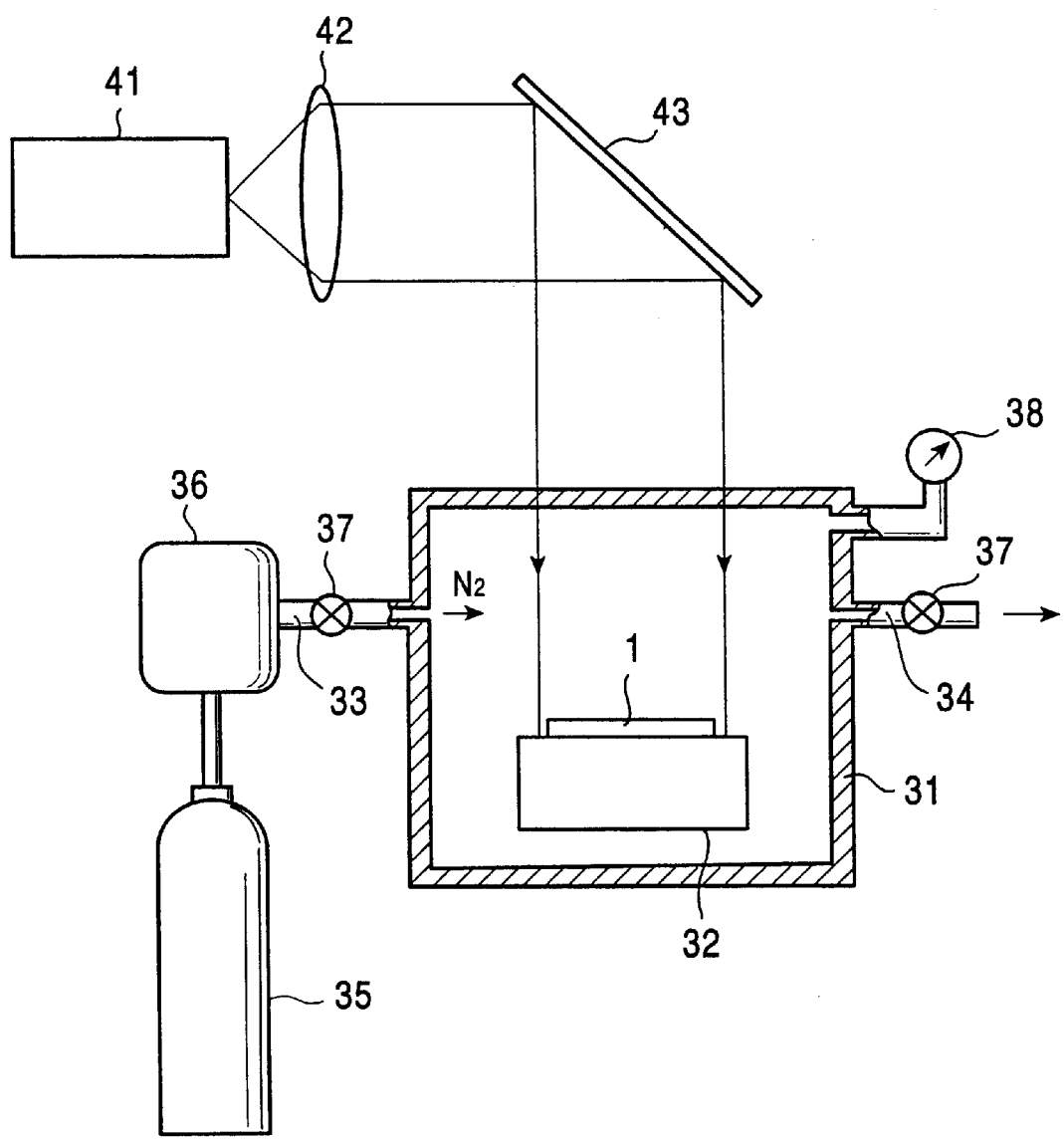
FIG. 6 is a schematic diagram illustrating an energy beam irradiating apparatus used to produce the semiconductor light emitting device shown in FIG. 1.

FIG. 6 illustrates the structure of an energy beam irradiating apparatus used herein. The energy beam irradiating apparatus has a reaction chamber 31 in which there is provided a susceptor on which a substrate 1 is placed. The susceptor 32 can be heated by a heater which is not shown in the figure. The reaction chamber 31 has a gas exhaust pipe 34 and a gas supply pipe 33 through which nitrogen gas is supplied into the reaction chamber 31 from a nitrogen gas cylinder 35 via a nitrogen gas purifier 36. The gas supply pipe 33 and the gas exhaust pipe 34 have their own valve 37. The reaction chamber 31 is also provided with a pressure gauge 38 for measuring the pressure in the reaction chamber 31.

The energy beam irradiating apparatus also includes an energy beam generator 41 for generating an energy beam toward a substrate 1 placed in the reaction chamber 31. The energy beam generator 41 comprises for example an excimer laser. The energy beam generated by the energy beam generator 41 is collimated by a lens 42 and then reflected by a reflecting plate 43 toward the substrate 1 so that the substrate 1 is irradiated with the energy beam.

The substrate 1 on which the alkali compound layer has been formed is taken out of the vacuum evaporation apparatus which is not shown in the figure, and it is placed into the energy beam irradiating apparatus. After quickly evacuating the energy beam irradiating apparatus, the apparatus is filled with an inert gas (such as argon (Ar), helium (He) or nitrogen gas). Furthermore, the evacuation and the supply of the inert gas or nitrogen gas are performed repeatedly so that the apparatus is finally filled with the inert gas or nitrogen at a pressure higher than normal atmospheric pressure (preferably at a pressure in the range of 2 to 10 atm). The high pressure in the apparatus is needed to prevent the alkali compound layer from being vaporized and lost during the irradiation of the energy beam. The reason why an inert gas or nitrogen gas is employed as a gas with which the inside of the apparatus is filled is that the inert gas is stable and that nitrogen gas behaves as a p-type impurity in II-VI group compound semiconductors. Although not shown in the figure, a cover made of a material such as quartz transparent to the energy beam may be placed on the substrate whereby the alkali compound layer is prevented from being evaporated and lost.

After filling the inside of the apparatus with the high-pressure ambient gas, the surface of the alkali compound layer (not shown) is irradiated with for example a pulse of an excimer laser beam. The wavelength of the laser beam may be properly selected from various values. More specifically, 248 nm or other wavelengths of KrF, 193 nm of ArF, or 308 nm of XeCl may be employed. Although there is no limitation in the wavelength, it is preferable that the wavelength be as short as the above examples. When the wavelength is short enough, it is possible to heat the substrate for only the limited part near the surface of the alkali compound layer. In contrast, when a long wavelength is employed, a wider region including a portion near the active layer 7 is heated. The result in this case is bad crystal quality and degradation in the characteristics of the device.

The pulse width and the output power (i.e., the energy) of the beam may be properly determined. In this specific embodiment, the pulse width is set to 20 nsec, and the output power is set, in the case where 248 nm of KrF is employed, to 20–90 $mJ/cm^2$ measured at the surface of the alkali compound layer. If the output power is too low, the alkali metal atoms in the alkali compound cannot be diffused into the second semiconductor layer 11. Conversely, if the output power is too high, the surface of the second semiconductor layer 11 is damaged and degradation occurs in the current-voltage characteristic. If irradiation of a beam having a high power is performed repeatedly many times, a reduction occurs in the number of carriers in the p-type II-VI semiconductor layers such as the first semiconductor layer 10 and the second semiconductor layer 11 doped with nitrogen serving as a p-type impurity, and thus the resistance of these layers becomes high. If the output power is still higher, there is a possibility that the current confining part, if there is such a part as is the case in this embodiment, is separated from the lower portion. The output power described herein is a value optimum for the wavelength of 248 nm, and the optimum output power varies with the wavelength employed.

The irradiation of the beam may be performed once or more times at the same output power level, or may be performed a plurality of times at different output power levels. In the case where the irradiation is performed at different output power levels, it is preferable that irradiation be performed at least once (more preferably a plurality of times) using a low-power beam at the first stage, and then further performed at least once using a high-power beam at the second stage. At the first stage, the irradiation of the low-power beam causes alkali metal atoms in the alkali compound layer to penetrate into the second semiconductor layer 11. At the second stage, the irradiation of the high-power beam causes the alkali metal atoms to diffuse into the second semiconductor layer 11. The irradiation of the high-power beam at the second stage also causes the alkali compound layer remaining on the surface to be evaporated and thus removed.

In the above beam irradiation process, the substrate 1 may be maintained at room temperature or may be heated via the susceptor 32 to a proper temperature, and the beam power may be adjusted depending on the substrate temperature.

As described above, the irradiation of the energy beam (such as an excimer laser beam) causes alkali metal atoms in the alkali compound layer to be partially diffused into the second semiconductor layer 11. Those alkali metal atoms incorporated into the second semiconductor layer 11 create p-type carriers and thus a contact layer 12 containing a high-density p-type impurity is formed on the surface of the second semiconductor layer 11. Most of the alkali compound layer on the surface is evaporated and lost.

Figure 4B:
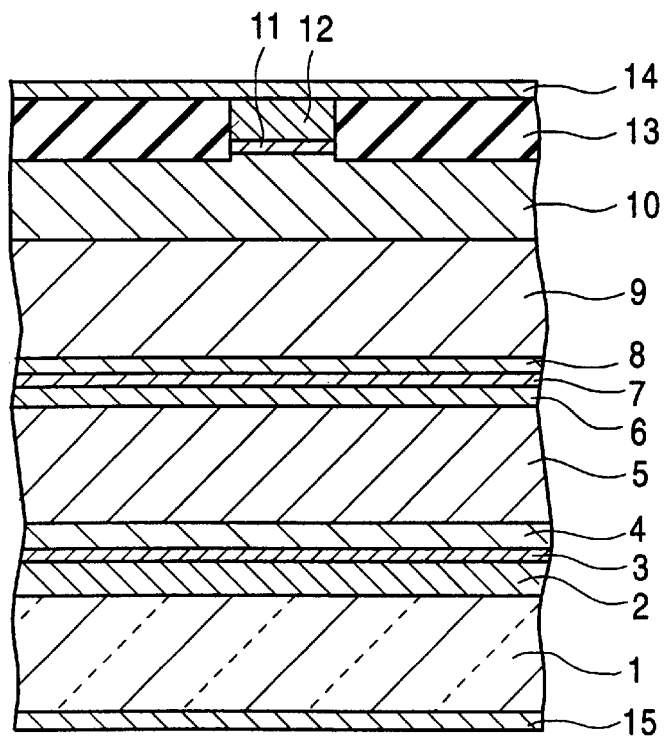

After completion of the above process, the substrate 1 on which the contact layer has been formed is taken out of the energy beam irradiating apparatus, and is placed into an evaporation apparatus which is not shown in the figure. A proper metal such as gold is evaporated on the contact layer 12 and the insulating layer 13 thereby forming the p-side electrode 14 as shown in FIG. 4B (p-side electrode formation step). Furthermore, for example indium is evaporated on the back surface of the substrate 1 thereby forming the n-side electrode 15 (n-side electrode formation step). In the above evaporation process, the p-side electrode 14 may be formed over the entire surface as shown in FIG. 4B or only in a particular area corresponding to the contact layer 12 (i.e., corresponding to the area where the alkali compound layer has been formed). Herein, "the area corresponding to the contact layer 12" refers to such an area in which the p-side electrode 14 is in contact with at least a part of the contact layer 12.

After forming the p-side electrode 14 and the n-side electrode 15, the substrate 1 is cleaved along planes perpendicular to the longitudinal direction of the contact layer 12 (perpendicular to the longitudinal direction of the resonator) at fixed intervals (for example of 600 nm) and reflecting mirror layers are formed on the cleavage surfaces. Then further cleavage is performed so that the substrate is further separated at the middle between adjacent stripe-shaped contact layers 12 into a plurality of chips (cleavage step). Thus, a semiconductor light emitting device in a complete form is obtained as shown in FIG. 1.

In this specific embodiment, the alkali compound layer formation step, the heat treatment step, and the p-side and n-side electrode formation step are performed in different apparatus. However, these steps may also be performed in the same single vacuum apparatus or in separate vacuum apparatus connected to each other via a transfer vacuum path so that the series of steps from the alkali compound layer formation step to the p-side and n-side electrode formation step is successively performed in a dry ambient containing no water. In this case, because the substrate is maintained in the dry ambient during the above processing steps, no water is absorbed by the deliquescent alkali compound layer and thus no degradation occurs in the current-voltage characteristic.

Figure 7:
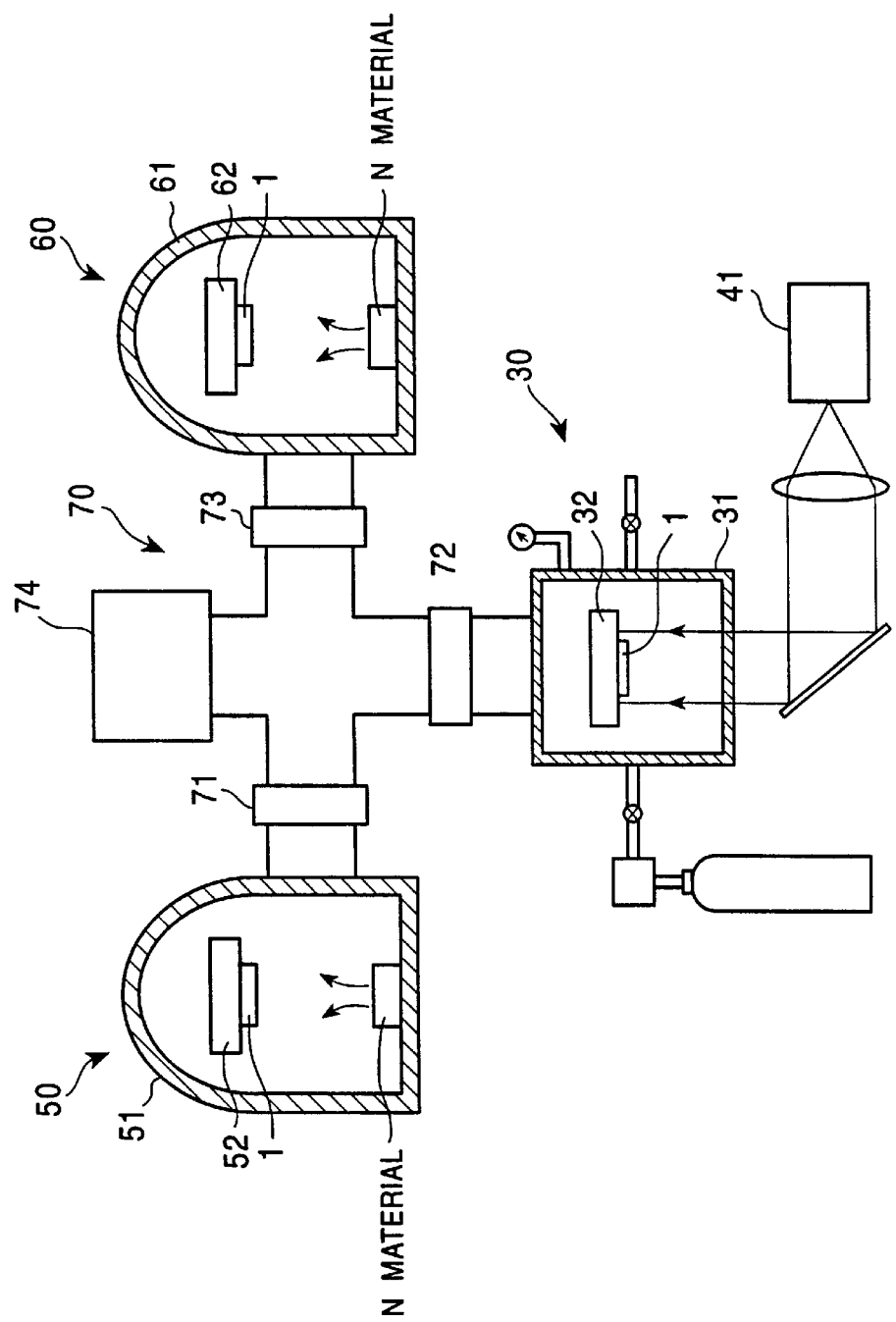
FIG. 7 is a schematic diagram illustrating a vacuum apparatus used to produce the semiconductor light emitting device shown in FIG. 1.

FIG. 7 illustrates an example of a preferable construction of vacuum apparatus. The vacuum apparatus comprises a first evaporation apparatus 50 for forming the alkali compound layer 16a, an energy beam irradiating apparatus 30 similar to the apparatus shown in FIG. 6 for performing the heating treatment, and a second evaporation apparatus 60 for forming the electrodes 14 and 15. The apparatus 50, 30 and 60 are connected via valves 71, 72, and 73, respectively, to a transfer vacuum chamber 70 having a substrate entrance/exit 74. The evaporation apparatus 50 and 60 have susceptors 51 and 61, respectively, which are disposed at locations opposite to source materials M in the respective vacuum chambers 51 and 61 so that various types of materials N can be deposited on the surface of the substrate 1 placed on the susceptors 52 and 62. Using this vacuum apparatus, an alkali compound layer is formed in the evaporation apparatus 50, and the substrate on which the alkali compound layer has been formed is transferred into the energy beam irradiating apparatus 30 via the transfer vacuum chamber 70. After performing a heat treatment in the energy beam irradiating apparatus 30, the substrate is transferred into the evaporation apparatus 60 via the transfer vacuum chamber 70 and the electrodes 14 and 15 are formed.

In the vacuum apparatus shown in FIG. 7, the evaporation apparatus 50, the energy beam irradiating apparatus 30, and the evaporation apparatus 60 are connected to each other via the transfer vacuum chamber 70. Instead of employing such a vacuum apparatus, evaporation and heat treatment by means of irradiation of an energy beam required in the alkali compound layer formation step, the p-side electrode formation step, and the n-side electrode formation step may all be performed in the same single vacuum chamber. Alternatively, evaporation in the alkali compound layer formation step, the p-side electrode formation step, and the n-side electrode formation step may be performed in the same single evaporation apparatus, and the energy beam irradiation may be performed in an energy beam irradiating apparatus separately disposed and connected to the evaporation apparatus via a transfer vacuum chamber. These methods are advantageous in that a highly-deliquescent alkali compound deposited on the inner wall of the vacuum chamber is covered with metal evaporated in the following step and thus the apparatus can be controlled into a desirable condition.

After completion of the heat treatment step, there is substantially no residual alkali compound layer. Therefore, the substrate can be taken into the atmosphere without encountering any problem. The vacuum apparatus shown in FIG. 7 may be modified such that only the evaporation apparatus 50 and the energy beam irradiating apparatus 30 are connected to each other via the transfer vacuum chamber 70 or such that a single vacuum chamber is used only for evaporation of the alkali compound and for energy beam irradiation. In any case, the alkali compound layer formation step and the heat treatment step are successively performed in a dry ambient.

The semiconductor light emitting device may also be produced as follows.

Figure 8A:
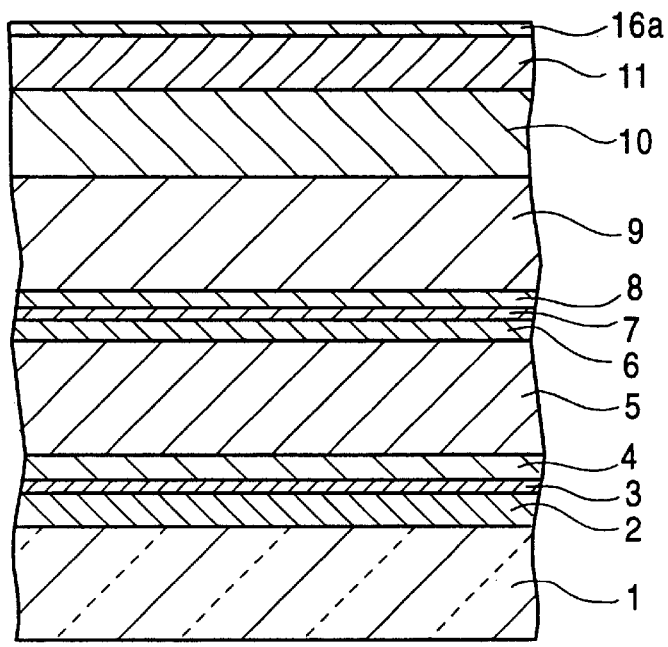
FIGS. 8A and 8B are cross-sectional views illustrating processing steps of producing the semiconductor light emitting device shown in FIG. 1, according to another production method.

FIGS. 8 and 9 illustrate the production processing steps employed herein. At the first step of this production method, the III-V group buffer layer 2, the first II-V group buffer layer 3, the second II-V group buffer layer 4, the n-type clad layer 5, the first guide layer 6, the active layer 7, the second guide layer 8, the p-type clad layer 9, the first semiconductor layer 10, and the second semiconductor layer 11 are epitaxially grown successively on the substrate 1 as shown in FIG. 8A in a similar manner to the multilayer formation step according to the previous method (multilayer formation step).

Subsequently, the surface of the second semiconductor layer 11 is cleaned in a manner similar to the above-described cleaning step according to the previous method (cleaning step). After that, the surface of the second semiconductor layer 11 is heated and dried in a similar manner to the heating and drying step according to the previous method (heating and drying step). Then as shown in FIG. 8A, the alkali compound layer 16a is formed on the second semiconductor layer 11 in a similar manner to the alkali compound layer formation step according to the previous method (alkali compound layer formation step). In this step, as in the alkali compound layer formation step according to the previous production method, the alkali compound layer 16a may be formed either over the entire surface of the second semiconductor layer 11 as shown in FIG. 8A, or only in a particular limited areas corresponding to the stripe-shaped current confining regions which will be formed in the current confining part formation step described later.

Figure 8B:
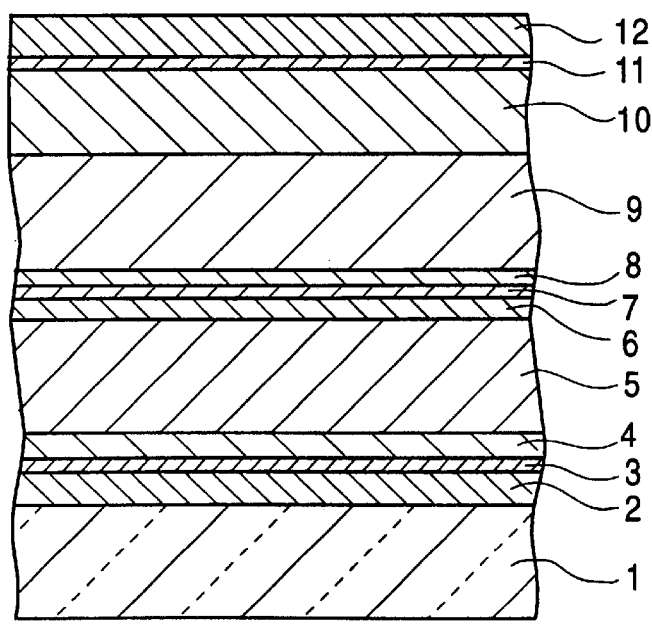

After forming the alkali compound layer 16a, a heat treatment is performed in a similar manner to the heat treatment step according to the previous method thereby altering a part, on the side adjacent to the alkali compound layer 16a, of the second semiconductor layer 11 and at least a part, in contact with the second semiconductor layer 11, of the alkali compound layer 16a thus forming the contact layer 12, as shown in FIG. 8B (heat treatment step).

Figure 9A:
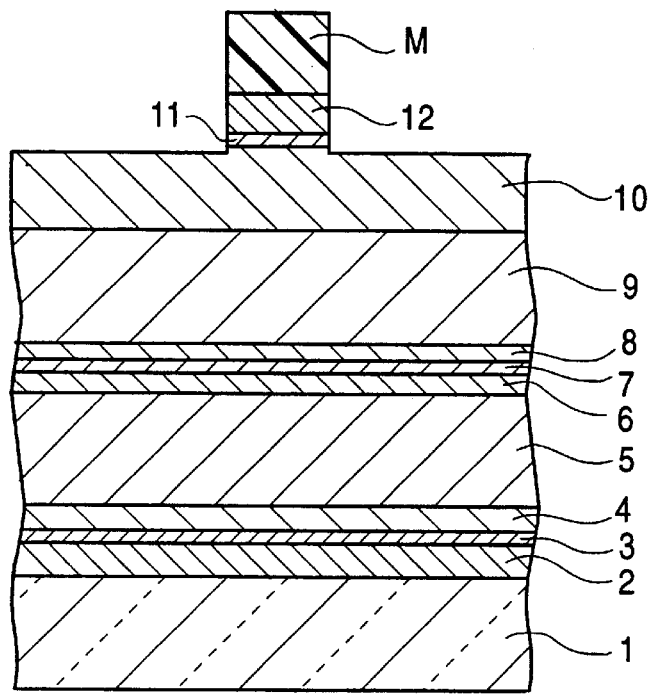
FIGS. 9A and 9B are cross-sectional views illustrating the processing steps following those shown in FIGS. 8A and 8B.
Figure 9B:
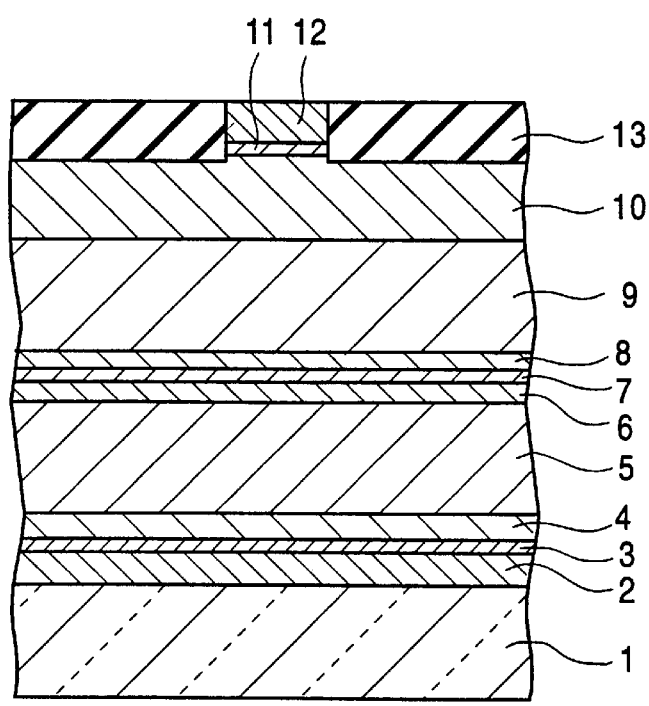

After completion of the heat treatment step, as in the current confining part formation step according to the previous method, the contact layer 12 and the second semiconductor layer 11 are selectively removed using a resist film M formed on the contact layer 12 as a mask as shown in FIG. 9A thereby converting the contact layer 12 and the second semiconductor layer 11 into the form of a plurality of parallel stripes so that they act as current confining parts. In FIG. 9A, only one of these stripes of the contact layer 12 and the second semiconductor layer 11 is shown in a representative fashion (FIG. 9B is also represented in a similar fashion). After that, as in the current confining part formation step according to the previous method, an insulating material such as aluminum oxide is evaporated over the entire surface, and the resist film M is then removed (lifted off) together with the part of the insulating material evaporated on the resist film M thereby forming the insulating layer 13 as shown in FIG. 9B (current confining part formation step).

After the formation of the current confining parts, as in the p-side electrode formation step and as in the n-side electrode formation step according to the previous method, the p-side electrode 14 is formed on the contact layer 12 and the insulating layer 13 (p-side electrode formation step) and the n-side electrode 15 is formed on the back surface of the substrate 1 (n-side electrode formation step). After that, the substrate 1 is cleaved (cleavage step) in a similar manner to the cleavage step according to the previous method. Thus, the semiconductor light emitting device in the complete form shown in FIG. 1 is obtained.

Also in this production method, the alkali compound layer formation step and the heat treatment step may be performed in the same single apparatus or in different vacuum apparatus connected to each other via a transfer vacuum chamber so that the process from the alkali compound layer formation step to the heat treatment step is successively performed in a dry ambient containing no water.

The operation of the semiconductor light emitting device produced in the above process is described below.

When a voltage is applied between the n-side electrode 15 and the p-side electrode 14 of the semiconductor light emitting device, a current is injected into the active layer 7. In the active layer 7, electron-hole recombination occurs whereby light is emitted. Since the semiconductor light emitting device has the low-resistance contact layer 12 formed between the p-side electrode 14 and the second semiconductor layer 11, the electric resistance at the interface between the p-side electrode 14 and the contact layer 12 becomes low and thus the voltage drop across the interface also becomes low. As a result, the semiconductor light emitting device can be operated with low electric power without generating a significantly great amount of heat, and thus a long device life can be achieved.

To verify the advantageous effects of the semiconductor light emitting device according to the present invention, a device having a different structure was also fabricated and comparison was made. The device for comparison was fabricated as follows. A II-VI group compound semiconductor (ZnSe) layer was grown on a substrate, and a thin layer (with a thickness of about 200 Å) of an alkali compound ($Na_2Se$) was evaporated thereon. After performing a heating process using the energy beam irradiating apparatus shown in FIG. 6, electric resistance was measured. In the above heating process, an excimer laser was employed as the energy beam generator 41, and a pulse train of excimer laser beam was applied to the device from the side on which the alkali compound is formed. The wavelength was 248 originating from KrF, the pulse width was set to 20 ns, the output power was 20 to 120 $mJ/cm^2$, and the number of pulses was varied within a certain range. The inside of the reaction chamber 31 was filled with a nitrogen ambient at a pressure of 2 atm, and the substrate was maintained at room temperature.

Figure 10:
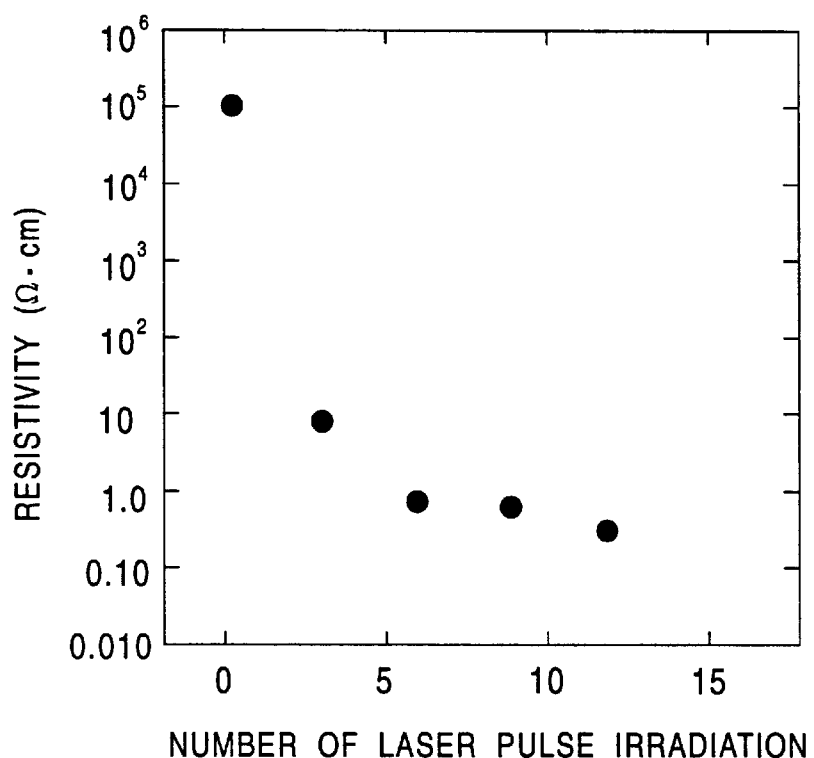
FIG. 10 is a graph illustrating the dependence of the electric resistance on the number of laser beam irradiation pulses.

The result is shown in FIG. 10 which represents the dependence of the electric resistance on the number of pulses applied. As can be seen from FIG. 4, the electric resistance decreases with the number of applied pulses. This is because alkali metal atoms (sodium atoms in this case) in the alkali compound are diffused into the II-VI group compound semiconductor (ZnSe) and they behave as a p-type impurity therein.

To verify the effects of the heating and drying process according to the method of producing a semiconductor light emitting device of the present embodiment, a semiconductor light emitting device having the structure shown in FIG. 1 was produced according to the method of the present embodiment, and the current-voltage characteristic thereof was evaluated. Furthermore, another sample was prepared by performing the process in the same manner as in the present embodiment from the beginning to the heat treatment step, then forming a p-side electrode 14 in a particular limited area corresponding to the contact layer 12, and finally cleaving the substrate along planes perpendicular to the longitudinal direction of the contact layer 12 at intervals of 1 mm. The current-voltage characteristic between the p-side electrodes of adjacent two semiconductor light emitting devices is evaluated. Furthermore, for the purpose of comparison, still another sample was prepared by performing the process which is the same as that employed in the present embodiment except that the heating and drying process is omitted, and the current-voltage characteristic of the obtained semiconductor light emitting device and the current-voltage characteristic between the p-side electrodes of adjacent semiconductor light emitting devices were evaluated.

In these samples, the width of the contact layer 12 (i.e., the width of the second semiconductor layer 11) was set to 10 $\mu$m, and $Na_2Se$ was evaporated in the alkali compound layer formation step. In the heat treatment step, a KrF excimer laser beam with a wavelength of 248 nm was employed wherein the pulse width, the output power, and the number of pulses were set to 20 ns, 90 mJ/cm$^2$, and 5, respectively. The heat treatment step was performed in the reaction chamber 31 filled with an nitrogen ambient at a pressure of 2 atm while the substrate 1 is maintained at room temperature.

Figure 11:
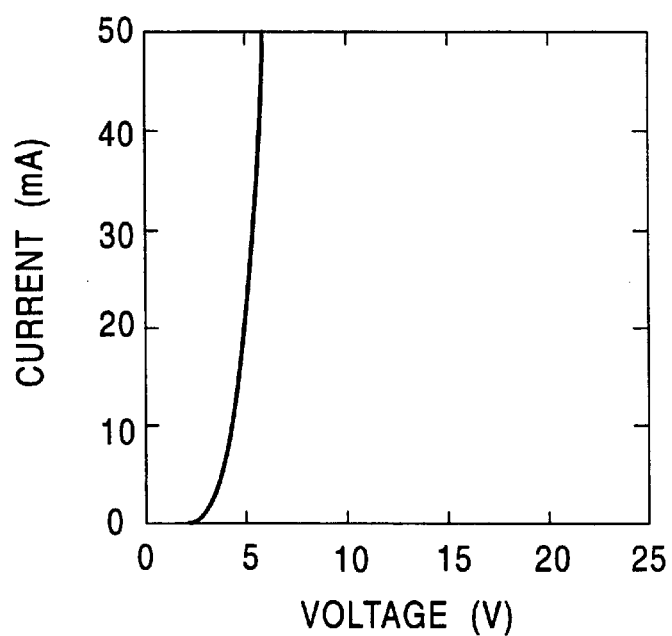
FIG. 11 is a graph illustrating the normal current range of current-voltage characteristic of the semiconductor light emitting device subjected to the heating and drying process according to the production method of the present invention.
Figure 12:
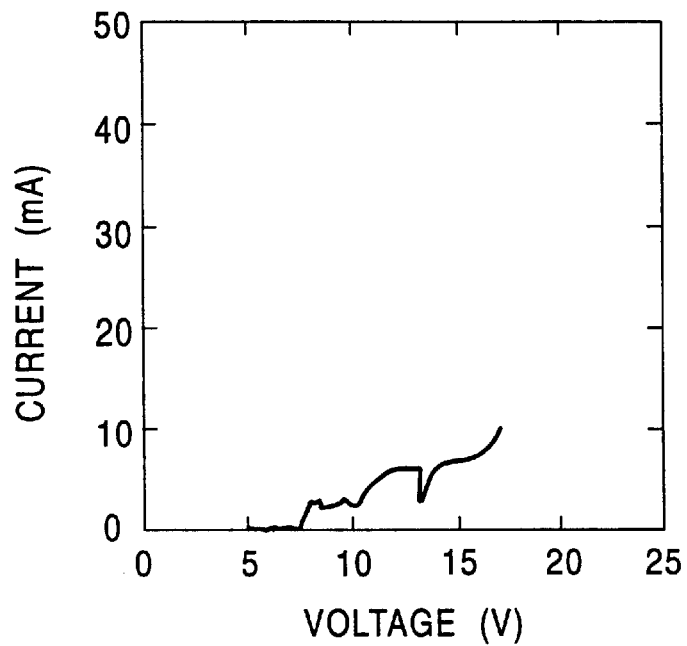
FIG. 12 is a graph illustrating the normal current range of current-voltage characteristic of the semiconductor light emitting device subjected to no heating and drying process, which was prepared for the purpose of comparison.
Figure 13:
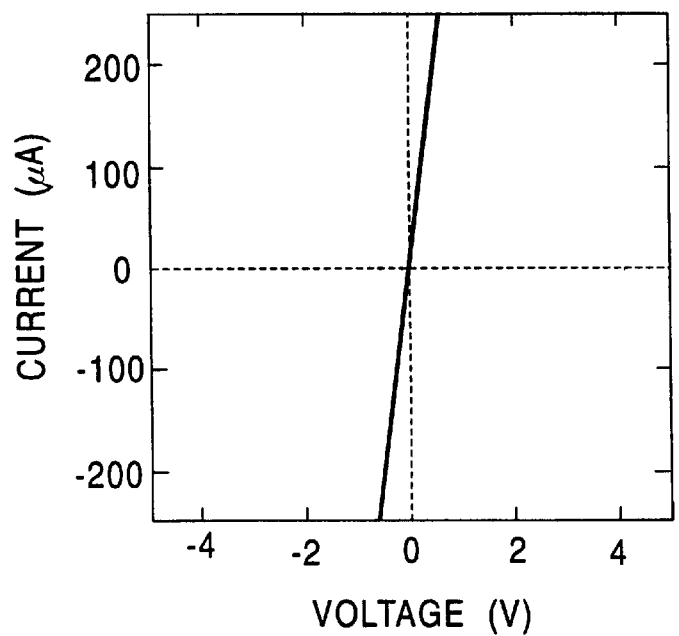
FIG. 13 is a graph illustrating the current-voltage characteristic between p-side electrodes of adjacent semiconductor light emitting devices subjected to the heating and drying process according to the production method of the present invention.
Figure 14:
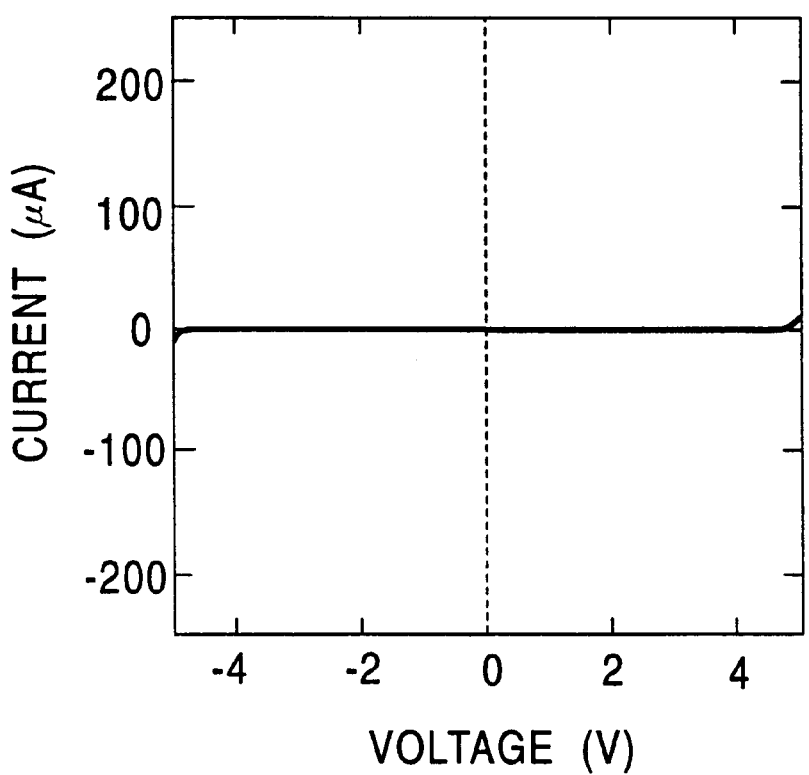
FIG. 14 is a graph illustrating the current-voltage characteristic between p-side electrodes of adjacent semiconductor light emitting devices subjected to no heating and drying process, which were prepared for the purpose of comparison.

The results are shown in FIGS. 11 to 14. FIG. 11 illustrates the current-voltage characteristic of the semiconductor light emitting device produced according to the method of the present embodiment. FIG. 12 illustrates the current-voltage characteristic of the semiconductor light emitting device prepared for the purpose of comparison. FIG. 13 illustrates the current-voltage characteristic between the p-side electrodes of adjacent light emitting devices produced according to the present embodiment. FIG. 14 illustrates the current-voltage characteristic between the p-side electrodes of adjacent light emitting devices prepared for the purpose of comparison.

As can be seen from FIG. 11, the semiconductor light emitting device subjected to the heating and drying process has a good current-voltage characteristic in which a current of 50 mA required for operating the semiconductor light emitting device is obtained by applying a low voltage of about 6 V. In contrast, as can be seen from FIG. 12, the semiconductor light emitting device subjected to no heating and drying process has a poor current-voltage characteristic in which a large enough current cannot be obtained when a voltage is applied. Furthermore, as can be seen from FIG. 13 in the semiconductor light emitting device subjected to the heating and drying process, a good ohmic contact is obtained at the interface between the p-side electrode 14 and the contact layer 12. In contrast, as can be seen from FIG. 14 in the semiconductor light emitting device subjected to no heating and drying process, an ohmic contact is not obtained. Thus it can be understood that the electric resistance at the interface between the p-side electrode 14 and the contact layer becomes low and thus the voltage drop across the interface also becomes low as a result of the heating and drying process.

Furthermore, in order to investigate the influence of energy beam irradiation conditions in the heat treatment process on the change in the characteristics, semiconductor light emitting devices were produced under various irradiation conditions (excimer laser beam irradiation conditions) while employing the same conditions as those employed to produce the semiconductor light emitting devices shown in FIGS. 11 and 13, and the current-voltage characteristic and also the current-voltage characteristic between adjacent p-side electrodes were evaluated.

In the above production, the excimer laser beam irradiation was performed in such a manner that ten pulses with output power of 29 mJ/cm$^2$ were applied at the first stage, and then one pulse with output power of 100 mJ/cm$^2$ was further applied at the second stage, in which the pulse width was fixed to 20 ns.

Figure 15:
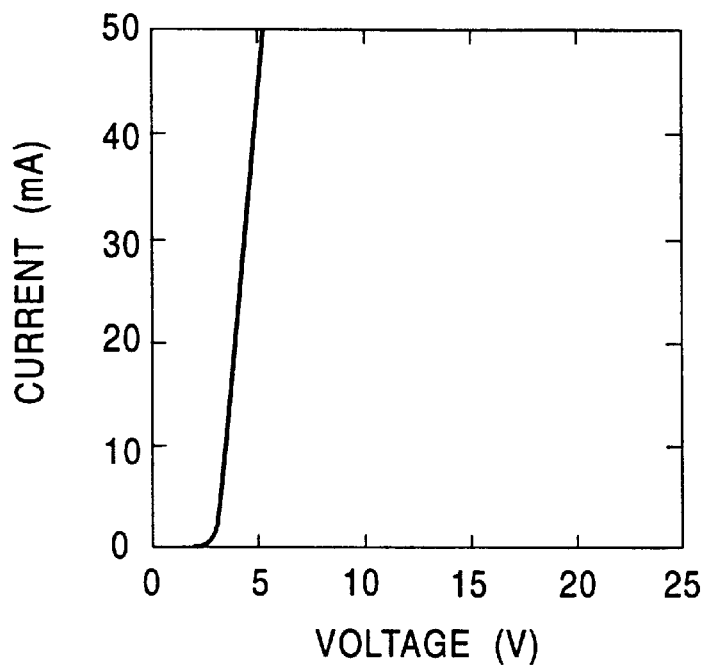
FIG. 15 is a graph illustrating the current-voltage characteristic of a semiconductor light emitting device subjected to two-stage-energy beam irradiation in the heat treatment process according to the production method of the invention.
Figure 16:
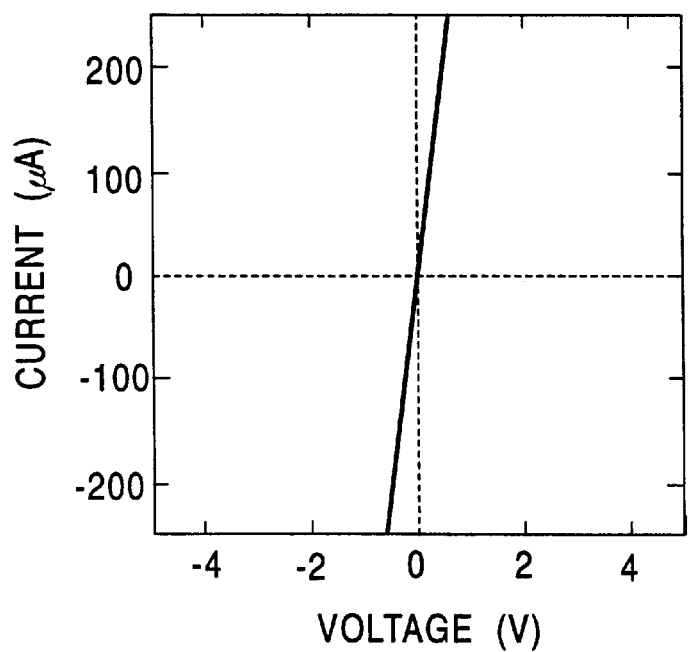
FIG. 16 is a graph illustrating the current-voltage characteristic between p-side electrodes of adjacent semiconductor light emitting devices subjected to two-stage energy beam irradiation in the heat treatment process according to the production method of the invention.

Results are shown in FIGS. 15 and 16. FIG. 15 illustrates the current-voltage characteristic of the semiconductor light emitting device subjected to the two-stage laser beam irradiation process. FIG. 16 illustrates the current-voltage characteristic between adjacent p-side electrodes of the semiconductor light emitting device subjected to the two-stage laser beam irradiation process. As can be seen from FIG. 15, if the excimer laser beam irradiation is performed in such a manner that the device is first irradiated with a low-energy beam at the first stage and then irradiated with a high-energy beam at the second stage, the resultant device exhibits a good characteristic in which a current of 50 mA can be obtained by applying a voltage as low as about 5.3 V. Compared with the device subjected to the irradiation of a plurality of pulses all having equal energy (a voltage of about 6 V is required to obtain a current of 50 mA; refer to FIG. 11), this device can be operated at a still lower voltage. Furthermore, as can be seen from FIG. 16, the device subjected to the two-stage excimer laser beam irradiation has a good ohmic contact at the interface between the p-side electrode 14 and the contact layer 12.

In the semiconductor light emitting device according to the present embodiment of the invention, as described above, the electric resistance at the interface between the p-side electrode 15 and the contact layer 12 and thus the voltage drop across the interface are reduced as a result of the formation of the contact layer, containing at least a product of thermal reaction of the second semiconductor layer 11 with an alkali compound, between the second semiconductor layer 11 and the p-side electrode 15. As a result, the semiconductor light emitting device can be operated with low power and with a reduced amount of heat generation thereby achieving an increased device life.

In other words, these advantages of the semiconductor light emitting device are achieved by forming the contact layer 12 between the second semiconductor layer 11 and the p-side electrode 14 in such a manner that at least a part of the contact layer 12 consists of a II-VI group compound semiconductor containing an alkali metal element as a p-type impurity.

In this semiconductor light emitting device in which the electric resistance between the p-side electrode and the II-VI group compound semiconductor layer is reduced by forming the contact layer 12, the structure is simplified compared with the structure of conventional devices having a superlattice layer or a composition-graded layer. This makes it possible to produce a semiconductor light emitting device having good crystal quality, and productivity particularly in mass production can be improved.

In the method of producing a semiconductor light emitting device according to the present embodiment of the invention, the alkali compound layer is formed on the second semiconductor layer 11 and then a heat treatment is performed thereby easily forming the contact layer 12 according to the embodiment thus realizing the semiconductor light emitting device according to the present embodiment of the invention.

Furthermore, in this method of producing a semiconductor light emitting device, before the process of forming the alkali compound layer, the heating and drying process is performed so as to remove water from the surface thereby ensuring that the contact layer 12 has a good current-voltage characteristic.

Second Embodiment

Figure 17:
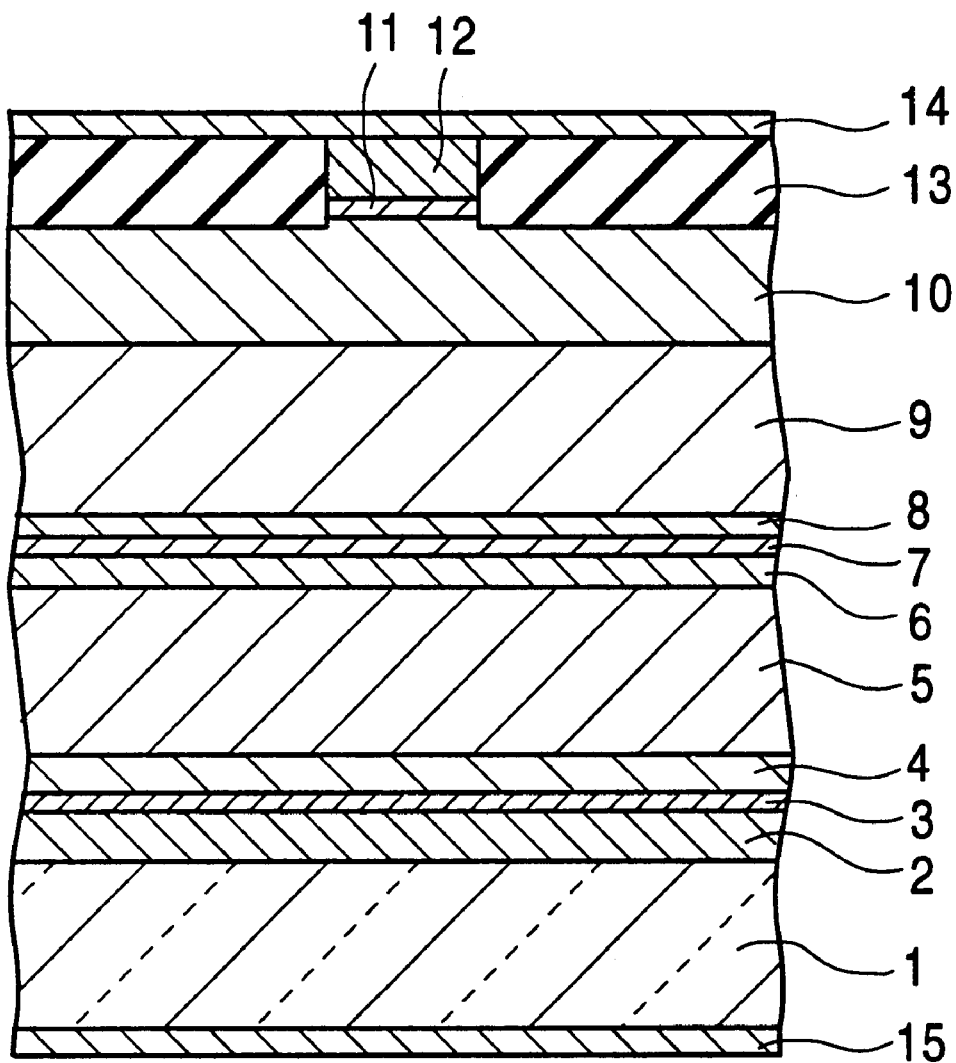
FIG. 17 is a cross-sectional view illustrating the structure of a semiconductor light emitting device according to a second embodiment of the invention.

FIG. 17 illustrates a second embodiment of a semiconductor light emitting device according to the invention. In this second embodiment, there is shown another specific example of II-VI group compound semiconductors used to form the second II-VI group buffer layer 4 of a II-VI compound semiconductor, the n-type clad layer 5, the first guide layer 6, the second guide layer 8, the p-type clad layer 9, and the first semiconductor layer 10 which have different compositions from those employed in the first embodiment. Herein, similar elements to those in the first embodiment are denoted by similar reference numerals, and they are not described in further detail.

The second II-VI group buffer layer 4 is formed for example of an n-type ZnBeSe mixed crystal doped with chlorine serving as an n-type impurity. The clad layer 5 is formed for example of an n-type ZnMgBeSe mixed crystal doped with chlorine serving as an n-type impurity. The first guide layer 6 is formed for example of a ZnBeSe mixed crystal doped with chlorine serving as an n-type impurity or doped with no impurities. The first guide layer 6 is formed for example of a ZnBeSe mixed crystal doped with chlorine serving as an n-type impurity or doped with no impurities. The p-type clad layer 9 is formed for example of a p-type ZnMgBeSe mixed crystal doped with nitrogen serving as a p-type impurity. The first semiconductor layer 10 is formed for example of a p-type ZnBeSe mixed crystal doped with nitrogen serving as a p-type impurity.

The semiconductor light emitting device having the above structure may be produced in a similar manner to that according to the first embodiment, and operates in a similar manner to that according to the first embodiment. This means that similar advantageous effects obtained in the semiconductor light emitting device according to the first embodiment can also be achieved in various structures having modified compositions of the respective II-VI group compound semiconductor layers, as long as the p-side electrode 15 is formed on a similar contact layer 12.

Third Embodiment

Figure 18:
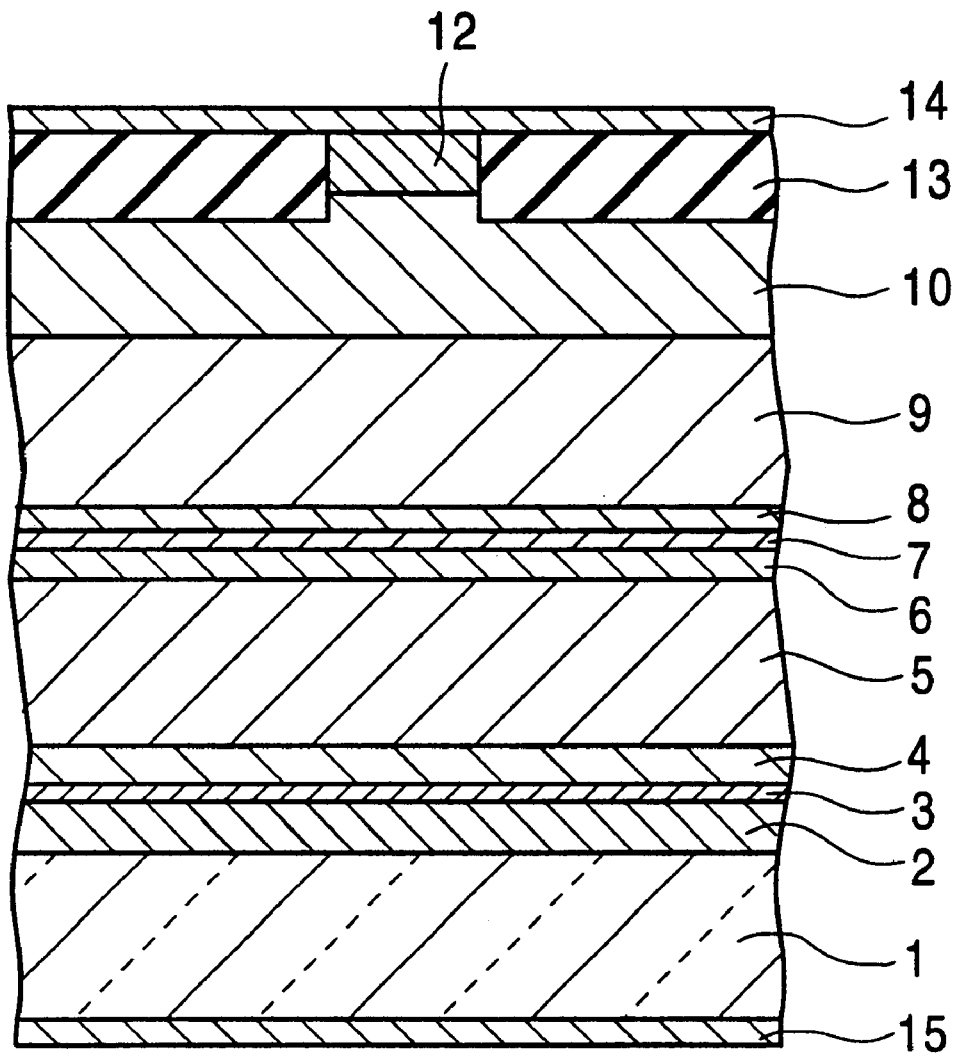
FIG. 18 is a cross-sectional view illustrating the structure of a semiconductor light emitting device according to a third embodiment of the invention.

FIG. 18 illustrates a third embodiment of a semiconductor light emitting device according to the present invention. This semiconductor light emitting device has a similar structure to that of the first embodiment except that the second semiconductor layer 11 is removed and the contact layer 12 is formed directly on the first semiconductor layer 10. Thus, similar elements to those in the first embodiment are denoted by similar reference numerals, and they are not described in further detail.

The semiconductor light emitting device having the above structure may be produced in a similar manner to that according to the first embodiment, and operates in a similar manner to that according to the first embodiment. That is, similar advantages to those obtained in the semiconductor light emitting device according to the first embodiment are also achieved in this third embodiment by means of forming the p-side electrode 14 on the contact layer 12 containing the alkali metal element serving as the p-type impurity.

The semiconductor light emitting device according to the second embodiment may also be constructed into a form in which there is no second semiconductor layer 11 as is the case in the third embodiment.

Fourth Embodiment

Figure 19:
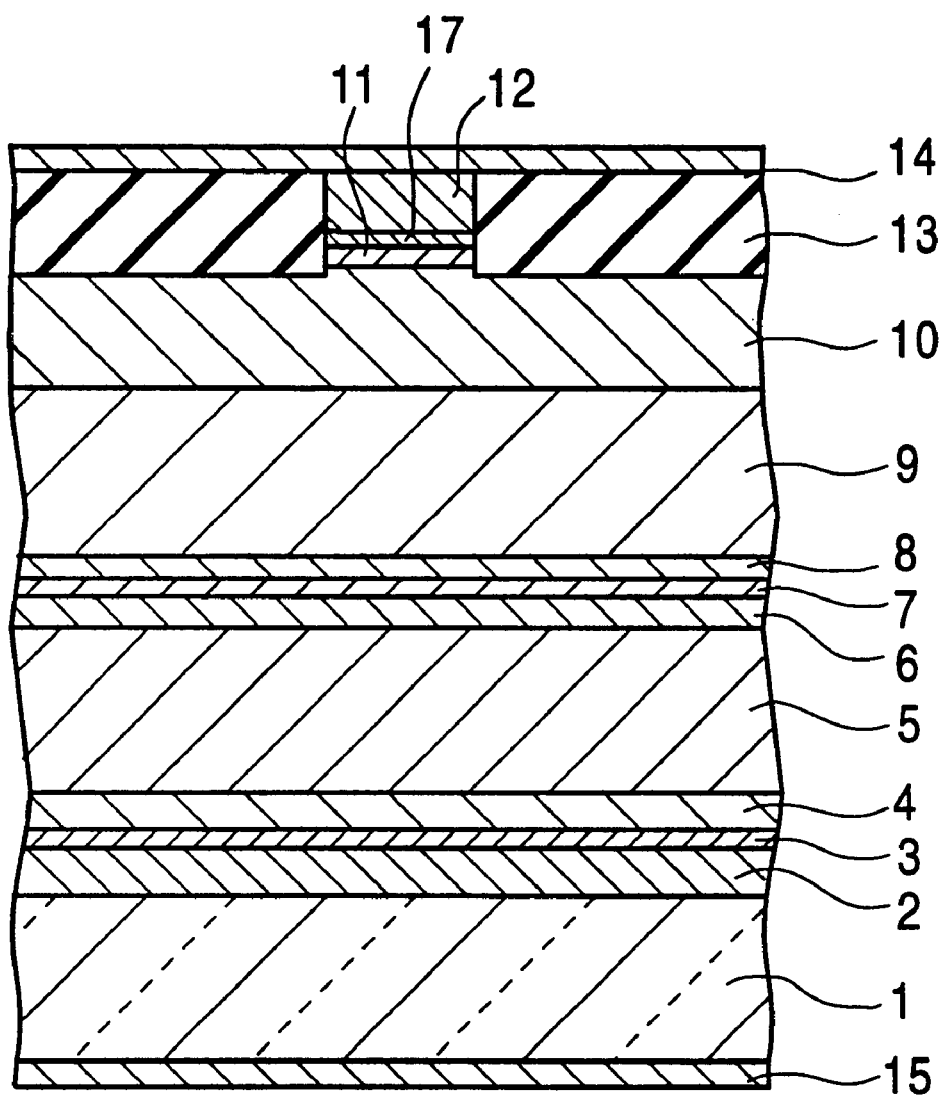
FIG. 19 is a cross-sectional view illustrating the structure of a semiconductor light emitting device according to a fourth embodiment of the invention.

FIG. 19 illustrates a fourth embodiment of a semiconductor light emitting device according to the present invention. This semiconductor light emitting device has a similar structure to that of the first embodiment except that a third semiconductor layer 17 is additionally formed between the second semiconductor layer 11 and the contact layer 12. Thus, similar elements to those in the first embodiment are denoted by similar reference numerals, and they are not described in further detail.

The third semiconductor layer 17 is made up of a II-VI group compound semiconductor superlattice layer or a graded layer of a II-VI group compound semiconductor in which the composition is changed in the direction of layer growth. For example, the third semiconductor layer 17 is made up of a superlattice layer comprising ZnSe layers serving as first II-VI group semiconductor layers and ZnTe layers serving as second II-VI group semiconductor layers wherein both ZnSe layers are doped with a p-type impurity such as nitrogen and they are disposed alternately. Alternatively, the third semiconductor layer 17 may be made up of a graded layer consisting of zinc as the II-group element and selenium and tellurium as the VI-group elements wherein the graded layer is doped with a p-type impurity such as nitrogen and wherein the selenium-tellurium composition ratio is varied in the direction of layer growth.

Specific preferable examples of the superlattice layer include a (ZnSe)m(ZnTe)n superlattice layer (m>5, n=1, 2) (refer to Japanese Patent Laid-Open No. 6-5920) and a superlattice layer in which one or two atomic layers of each ZnSe layer consisting of 10 atomic layers are replaced by an atomic layer of ZnTe wherein only the ZnTe layers are δ-doped with nitrogen serving as a p-type impurity at a density of about $1 \times 10^{20}$ cm$^{-3}$ so that a carrier concentration of about $1 \times 10^{19}$ cm$^{-3}$ is obtained over the entire superlattice layer.

As well as the second semiconductor layer 11 and the contact layer 12, the third semiconductor layer 17 is also formed into a stripe shape with a width of for example 10 μm which serves as a current confining part in which a current is confined.

The semiconductor light emitting device having the above structure can be produced in a similar manner to that of the first embodiment. In this semiconductor light emitting device, the third semiconductor layer 17 formed between the contact layer 12 and the second semiconductor layer 11 brings about a further reduction in the electric resistance compared to the electric resistance of the semiconductor light emitting device according to the first embodiment.

In the semiconductor light emitting device according to the present embodiment of the invention, as described above, a further reduction in the electric resistance and thus a further reduction in the voltage drop are obtained as a result of the formation of the third semiconductor layer 17 in the form of a superlattice layer or a graded layer between the contact layer 12 and the second semiconductor layer 11 (i.e., between the contact layer 12 and the p-type clad layer 9). As a result, the semiconductor light emitting device can be operated with further lower power, and a further reduction in the amount of heat generation is achieved. Thus a further increase in the device life is achieved.

The semiconductor light emitting device according to the second embodiment may also be constructed into a form in which there is provided a third semiconductor layer 17 between the second semiconductor layer 11 and the contact layer 12, as is the case in this fourth embodiment.

Fifth Embodiment

Figure 20:
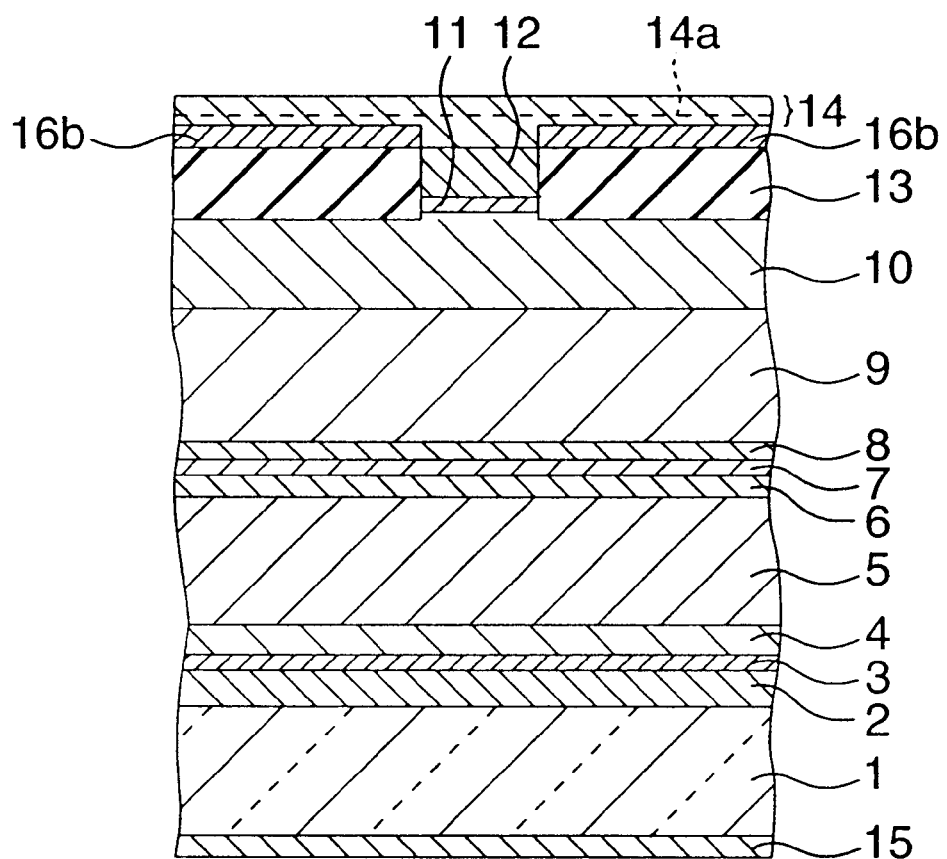
FIG. 20 is a cross-sectional view illustrating the structure of a semiconductor light emitting device according to a fifth embodiment of the invention.

FIG. 20 illustrates a fifth embodiment of a semiconductor light emitting device according to the invention. This semiconductor light emitting device has a similar structure to that of the first embodiment except that there is an alkali compound layer 16b between the insulating layer 13 and the p-side electrode 14 and that the p-side electrode 14 has a diffusion barrier layer 14a located on the side adjacent to the contact layer 12. Thus, similar elements to those in the first embodiment are denoted by similar reference numerals, and they are not described in further detail.

The alkali compound layer 16b is formed so that it is used in a later processing step to form the contact layer 12, as will be described later. The alkali compound layer 16b may be a compound of an alkali metal and a VI-group element, or alkali metal and phosphorus, or otherwise alkali metal, a VI-group element and phosphorus. More specifically, the alkali compound layer 16b may be a similar compound to that employed in the first embodiment. In this embodiment, although the alkali compound layer 16b is formed between the insulating layer 13 and the p-side electrode 14, the alkali compound layer can be vaporized in the following steps as will be described later, and thus there can be no alkali compound layer.

The diffusion barrier layer 14a of the p-side electrode 14 prevents elements constituting the p-side electrode 14 from being diffused toward the contact layer 12 during the subsequent processing steps described later, and also prevents the alkali compound layer 16b from being vaporized during the heat treatment. Preferably, the diffusion barrier layer 14a is made of a high-melting point metal or a metal containing a high-melting point metal. Herein, the high-melting point metal refers to a metal having a melting point of 1000° C. or higher, such as gold (Au), copper (Cu), manganese (Mn), molybdenum (Mo), niobium (Nb), nickel (Ni), palladium (Pd), platinum (Pt), tantalum (Ta) and titanium (Ti). That is, in a preferable mode, the diffusion barrier layer 15a consists of at least one of these metals. More preferably, a metal having a melting point higher than 1200° C. is employed, and titanium is most preferable.

The semiconductor light emitting device having the above structure can be produced in a similar manner to that of the first embodiment except that a heat treatment is performed after forming the p-side electrode 14. In the p-side electrode formation step, for example a metal (such as titanium) used to form the diffusion barrier layer 14a is first evaporated to a thickness of for example 10 nm, and then for example gold is evaporated to a thickness of 300 nm. The diffusion barrier layer prevents the alkali compound from being vaporized in the later processing steps and also prevents elements constituting the p-side electrode 14 from being diffused toward the contact layer 12.

There is a possibility that the p-side electrode 14 is partially lost during the heat treatment process. To deal with such a loss of the p-side electrode 14, the p-side electrode 14 may be formed again after the heat treatment process (p-side electrode re-forming step). In this case, it is not required to form the diffusion barrier layer 14a.

The semiconductor light emitting device having the above structure has similar advantages to those achieved in the first embodiment. That is, advantages similar to those achieved in the first embodiment are also achieved in this fifth embodiment as a result of the formation of the p-side electrode 14 on the contact layer 12 containing the alkali metal element serving as the p-type impurity.

To verify the advantageous effects of the semiconductor light emitting device according to the present invention, a device having a different structure was also fabricated and comparison was made. The device for comparison was fabricated as follows. A II-VI group compound semiconductor (ZnSe) layer was grown on a substrate, and a thin layer (with a thickness of about 200 Å) of an alkali compound ($Na_2Se$) was evaporated thereon. Furthermore, metals (titanium with a thickness of 10 nm and gold with a thickness of 300 nm) were evaporated thereon thereby forming an electrode. After performing a heating process using the energy beam irradiating apparatus shown in FIG. 6, electric resistance was measured. The heat treatment process was performed under the same conditions as in the experiment performed in the first embodiment. As in the first embodiment, the electric resistance decreases with the number of pulses.

The semiconductor light emitting device according to any of second through fourth embodiments may also be constructed into a similar form using a similar production process.

Sixth Embodiment

In this sixth embodiment of the invention, an optical device provided with a semiconductor light emitting device according to the present invention is disclosed. As an example of such an optical device, an optical disk reproducing apparatus is described below.

Figure 21:
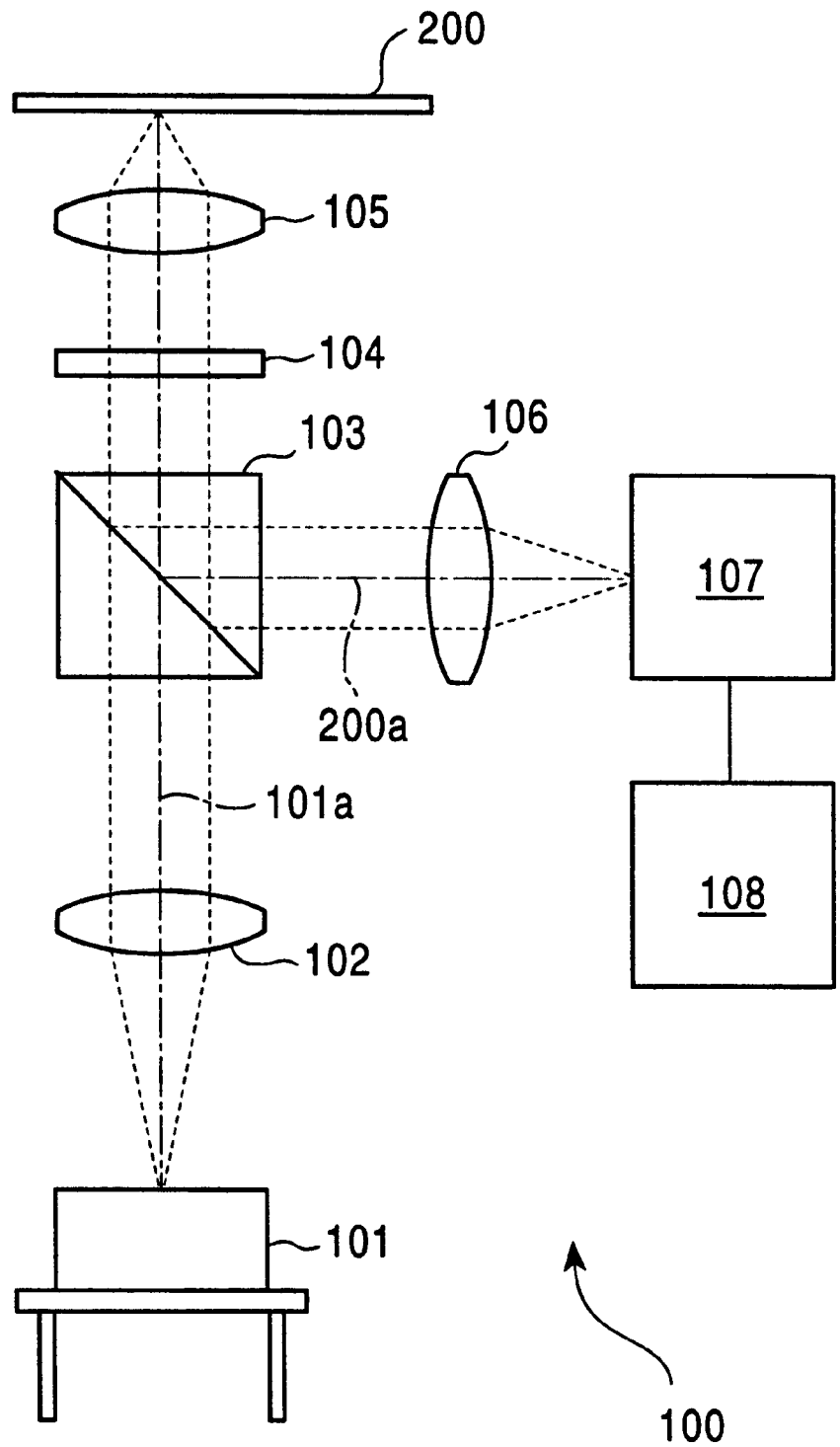
FIG. 21 is a schematic diagram illustrating an optical disk reproducing apparatus according to an embodiment of the invention.

FIG. 21 illustrates the construction of an optical disk reproducing apparatus 100. this optical disk reproducing apparatus 100 is designed to reproduce information recorded on an optical disk 200. For this purpose, the optical disk reproducing apparatus 100 has a semiconductor light emitting device 101 for emitting light with a wavelength between green and blue. A semiconductor light emitting device according to any of first through fifth embodiments described above may be employed as the semiconductor light emitting device 101. The optical disk reproducing apparatus 100 further includes a known optical system for transmitting a light beam output from the semiconductor light emitting device 101 to the optical disk 200. The optical system comprises a collimator lens 102, a beam splitter 103, a $\lambda/4$ plate 104, an objective lens 105, a detection lens 106, a signal light detection photosensor 107, and a signal light reproducing circuit 108.

In this optical disk reproducing apparatus 100, the light emitted from the semiconductor light emitting device 101 is collimated by the collimator lens 102, and is incident on the $\lambda/4$ plate 104 via the beam splitter 103. The $\lambda/4$ plate 104 adjusts the polarization of the light, and the resultant light is focused onto the optical disk 200 via the objective lens 105. Signal light 200 is produced as a result of reflection by the optical disk 200, and is incident on the beam splitter 103 via the objective lent 105 and the $\lambda/4$ plate 104. The beam splitter 103 reflects the signal light 200 toward the detection lens 106. After passing through the detection lens, the signal light 200 is incident on the signal light detection photosensor 107. The signal light detection photosensor 107 converts the received signal light to a corresponding electric signal, which is transferred to the signal light reproducing circuit 108. Thus, information written on the optical disk 200 is reproduced from the signal light reproducing circuit 108.

Since the semiconductor light emitting device 101 used herein has the structure according to the invention, the electric resistance at the interface between the p-side electrode 14 and the contact layer 12 is reduced, and thus it can be operated with reduced electric power and an increased device life is achieved. As a result of the application of the semiconductor light emitting device 101 having such advantages to the optical disk reproducing apparatus 100, the operating power of the optical disk reproducing apparatus 100 is reduced, and the life of the optical disk 200 and that of the optical disk reproducing apparatus 100 are improved.

Although in this specific embodiment the semiconductor light emitting device according to the invention is applied to the optical disk reproducing apparatus, it may also be applied to other various optical apparatus such as an optical disk recording apparatus, an optical disk recording/reproducing apparatus, an optical communication apparatus, a display device, an optical analysis or detection instrument, and a device provided with a semiconductor laser which is installed on a car and is operated in a high-temperature environment.

Although the present invention has been described above with reference to specific embodiments, the invention is not limited to the details of these embodiments, but various modifications and changes are possible. That is, in the respective embodiments described above, the first II-VI group compound semiconductor 3, the second II-VI group buffer layer 4, the n-type clad layer 5, the first guide layer 6, the active layer 7, the second guide layer 8, the p-type clad layer 9, the first semiconductor layer 10, and the second semiconductor layer 11 are made of specific kinds of II-VI group compound semiconductors. However, in the present invention, the respective layers may also be formed of other proper kinds of II-VI group compound semiconductors (comprising at least one II-group element selected from the group consisting of zinc, magnesium, cadmium, manganese, mercury, and beryllium and at least one VI-group element selected from the group consisting of oxygen; selenium, sulfur, and tellurium).

Furthermore although in the embodiments described above, the active layer 7 is sandwiched between the guide layers 6 and 8 and they are further sandwiched between the guide layers 6 and 8, the active layer 7 may be disposed for example directly between clad layers without interposing guide layers.

Furthermore, although in the above embodiments, the current confining part are constructed with the stripe-shaped contact layer 12, the current confining part constructed in a different fashion also falls within the scope of the present invention.

Still furthermore, although in the above embodiments, the contact layer 12 is formed by means of irradiation of an energy beam, the present invention also includes, in its scope, other methods of forming the contact layer 12 using different heating processes.

Still furthermore, although in the above embodiments, the contact layer 12 contains a product of thermal reaction between an alkali compound and a II-VI group compound semiconductor or contains an alkali compound as well as such a thermal reaction product, similar advantageous effects can also be achieved by forming the contact layer 12 so that at least a part of it is formed of a II-VI compound semiconductor containing an alkali metal element serving as a p-type impurity. That is, semiconductor light emitting devices having a contact layer 12 formed by means of a process other than heat treatments also fall within the scope of the invention.

Still furthermore, although in the above embodiments the respective layers are grown on the substrate 1 using the solid source MBE technique, gas source MBE or MOCVD (metal organic chemical vapor deposition) or other techniques may also be employed to grow the layers.

In the semiconductor light emitting device according to an aspect of the present invention, as described above, the contact layer is disposed between the p-type clad layer and the p-side electrode so that at least a part of the contact layer is formed of a II-VI compound semiconductor containing an alkali metal element serving as a p-type impurity thereby achieving a reduced electric resistance at the interface between the p-side electrode and the contact layer and thus a reduced voltage drop across the interface. Therefore, the semiconductor light emitting device can be operated with low electric power, and thus the amount of heat generated is reduced. Thus an improved device life is achieved. Furthermore, the device structure is simplified and it becomes possible to easily produce a semiconductor light emitting device having good crystal quality. As a result, productivity particularly in mass production is improved.

In the semiconductor light emitting device according to another aspect of the present invention, as described above, the contact layer is disposed between the p-type clad layer and the p-side electrode wherein the contact layer contains at least a product of thermal reaction between an alkali compound and a II-VI group compound semiconductor so that the electric resistance at the interface between the p-side electrode and the contact layer is reduced to a similar level to that achieved in the semiconductor light emitting device according to the previous aspect of the invention. Thus, similar advantageous effects are also achieved.

In the method of producing a semiconductor light emitting device according to an aspect of the invention, after forming the alkali compound layer, the p-side electrode is formed in the area corresponding to the alkali compound layer. This makes it possible to easily produce a semiconductor light emitting device according to the invention. That is, semiconductor light emitting devices according to the invention can be realized by this production method.

Furthermore, since the optical device according to the invention has a semiconductor light emitting device according to the invention, the electric power required to operate the optical device is reduced and an improved life is achieved as a result of the improvement of power consumption and life of the semiconductor light emitting device employed.

What is claimed is:

1. A semiconductor light emitting device comprising at least an n-type clad layer, an active layer, and a p-type clad layer formed into a multilayer structure using a II-VI compound semiconductor containing at least one II-group element selected from the group consisting of zinc (Zn), magnesium (Mg), beryllium (Be), cadmium (Cd), manganese (Mn), and mercury (Hg) and at least one VI-group element selected from the group consisting of oxygen (O), sulfur (S), selenium (Se), and tellurium (Te), said semiconductor light emitting device also comprising a p-side electrode electrically connected to said p-type clad layer, said semiconductor light emitting device being characterized in that:

a contact layer is provided between said p-type clad layer and said p-side electrode, said contact layer being formed, at least in part, of a II-VI group semiconductor containing an alkali metal element serving as a p-type impurity; and said p-side electrode includes, at least in a part thereof, a diffusion barrier layer for preventing an element constituting said p-side electrode from being diffused toward said contact layer.

2. A semiconductor light emitting device according to claim 1, wherein said diffusion barrier layer contains at least one element selected from the group consisting of gold (Au), copper (Cu), manganese (Mn), molybdenum (Mo), niobium (Nb), nickel (Ni), palladium (Pd), platinum (Pt), tantalum (Ta) and titanium (Ti).

3. A semiconductor light emitting device comprising at least n-type clad layer, an active layer, and a p-type clad layer formed into a multilayer structure using a II-VI compound semiconductor containing at least one II-group element selected from the group consisting of zinc (Zn), magnesium (Mg), beryllium (Be), cadmium (Cd), manganese (Mn), and mercury (Hg) and at least one VI-group element selected from the group consisting of oxygen (O), sulfur (S), selenium (Se), and tellurium (Te), said semiconductor light emitting device also comprising a p-side electrode electrically connected to said p-type clad layer, said semiconductor light emitting device being characterized in that:

a contact layer is provided between said p-type clad layer and said p-side electrode, said contact layer being formed at least in part of a II-VI group semiconductor layer containing an alkali metal element serving as p-type impurity; and said semiconductor layer and the contact layer are disposed between laterally opposed insulating layers, and within a thickness dimension of said layers, wherein said p-side electrode includes, at least in a part thereof, a diffusion barrier layer for preventing an element constituting said p-side electrode from being diffused toward said contact layer.

4. A semiconductor light emitting device according to claim 3, wherein said diffusion barrier layer contains at least one element selected from the group consisting of gold (Au), copper (Cu), manganese (Mn), molybdenum (Mo), niobium (Nb), nickel (Ni), palladium (Pd), platinum (Pt), tantalum (Ta) and titanium (Ti).

5. An optical device including a semiconductor light emitting device, said semiconductor light emitting device comprising at least an n-type clad layer, an active layer, and a p-type clad layer formed into a multilayer structure using a II-VI compound semiconductor containing at least one II-group element selected from the group consisting of zinc (Zn), magnesium (Mg), beryllium (Be), cadmium (Cd), manganese (Mn), and mercury (Hg) and at least one VI-group element selected from the group consisting of oxygen (O), sulfur (S), selenium (Se), and tellurium (Te), said semiconductor light emitting device also comprising a p-side electrode electrically connected to said p-type clad layer, wherein, a contact layer is provided between said p-type clad layer and said p-side electrode, said contact layer being formed, at least in part, of a II-VI group semiconductor containing an alkali metal element serving as a p-type impurity; and said p-type electrode includes, at least in part thereof, a diffusion barrier layer for preventing an element constituting said p-side electrode from being diffused toward said contact layer.

* * * * *